(12) United States Patent  
Yuan

(10) Patent No.: US 12,096,656 B2  
(45) Date of Patent: Sep. 17, 2024

(54) ARRAY SUBSTRATE AND MANUFACTURING METHOD THEREOF, AND DISPLAY PANEL

(71) Applicant: Xiamen Tianma Micro-Electronics Co., Ltd., Xiamen (CN)

(72) Inventor: Yong Yuan, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 500 days.

(21) Appl. No.: 17/402,610

(22) Filed: Aug. 15, 2021

(65) Prior Publication Data

US 2021/0376029 A1 Dec. 2, 2021

Related U.S. Application Data

(63) Continuation-in-part of application No. 16/701,179, filed on Dec. 3, 2019, now Pat. No. 11,107,839.

(30) Foreign Application Priority Data

Jun. 12, 2019 (CN) .......................... 201910507078.5

(51) Int. Cl.
*H01L 27/12* (2006.01)
*H01L 51/56* (2006.01)
(Continued)

(52) U.S. Cl.
CPC ..... *H10K 59/1213* (2023.02); *H10K 59/1216* (2023.02); *H10K 59/126* (2023.02);
(Continued)

(58) Field of Classification Search
CPC ............. H10K 59/1213; H10K 59/121; H10K 59/1216; H10K 59/126; H10K 59/1201;
(Continued)

(56) References Cited

U.S. PATENT DOCUMENTS 9,502,434 B2 * 11/2016 Tanaka ................ H01L 29/7869
10,558,100 B2 * 2/2020 Lee ........................ H01L 27/124
(Continued)

FOREIGN PATENT DOCUMENTS

CN 103176321 A 6/2013
CN 108172595 A 6/2018
(Continued)

*Primary Examiner* — Nikolay K Yushin
(74) *Attorney, Agent, or Firm* — KILPATRICK TOWNSEND & STOCKTON LLP

(57) ABSTRACT

Provided are an array substrate, a manufacturing method thereof, and a display panel. The array substrate includes: a substrate, a first active layer of a first thin film transistor, a first insulating layer, a first metal layer, and a second active layer of a second thin film transistor. The first metal layer includes a first connection portion, which overlaps one of a source contact region or a drain contact region of the first active layer and overlaps one of a source contact region or a drain contact region of the second active layer. The one of the source contact region or the drain contact region of the first active layer and the one of the source contact region or the drain contact region of the second active layer overlap each other, and are electrically connected through a via in the first insulating layer and the first connection portion.

19 Claims, 21 Drawing Sheets

(51) Int. Cl.
*H10K 59/121* (2023.01)
*H10K 59/126* (2023.01)
*H10K 71/00* (2023.01)
*H01L 29/66* (2006.01)
*H01L 29/786* (2006.01)
*H10K 59/12* (2023.01)

(52) U.S. Cl.
CPC .......... *H10K 71/00* (2023.02); *H01L 27/1225* (2013.01); *H01L 27/1251* (2013.01); *H01L 27/1255* (2013.01); *H01L 27/127* (2013.01); *H01L 29/66757* (2013.01); *H01L 29/66969* (2013.01); *H01L 29/78633* (2013.01); *H01L 29/78675* (2013.01); *H01L 29/7869* (2013.01); *H10K 59/1201* (2023.02)

(58) Field of Classification Search
CPC ...... H10K 59/12; H10K 59/123; H10K 71/00; H10K 71/191; H10K 71/20; H10K 71/60; H10K 71/231; H01L 27/1225; H01L 27/12; H01L 27/1251; H01L 27/1255; H01L 27/127; H01L 27/124; H01L 29/66757; H01L 29/66; H01L 29/66969; H01L 29/78633; H01L 29/786; H01L 29/78675; H01L 29/7869; H01L 29/41733; H01L 21/02365; H01L 21/32139; H01L 21/288; H01L 21/02194
See application file for complete search history.

(56) References Cited

U.S. PATENT DOCUMENTS 11,107,839 B2\* 8/2021 Yuan .................... H01L 27/1255
2018/0197974 A1\* 7/2018 Takamaru ......... G02F 1/136286
2019/0302548 A1\* 10/2019 Lee .................. G02F 1/133514

FOREIGN PATENT DOCUMENTS

| CN | 109244082 A | 1/2019 |
| TW | 201603128 A | 1/2016 |

\* cited by examiner

ARRAY SUBSTRATE AND MANUFACTURING METHOD THEREOF, AND DISPLAY PANEL

CROSS-REFERENCES TO RELATED APPLICATIONS

This application is a continuation-in-part of U.S. patent application Ser. No. 16/701,179 filed Dec. 3, 2019, disclosure of which is incorporated herein by reference in its entirety.

FIELD

The present disclosure relates to the field of the display technology and, in particular, to an array substrate, a manufacturing method of an array substrate, and a display panel including the array substrate.

BACKGROUND

In the related art, flat panel displays are classified into an active matrix display and a passive matrix display according to their driving methods. The active matrix display differs from the passive matrix display in that a circuit structure of the active matrix display includes an active element, which is typically a thin film transistor. The operation of pixels of the active matrix display is controlled through the thin film transistor.

However, the circuit structure includes thin film transistors, which collectively control the pixel to emit light. The circuit structure is relative complex, and includes elements. Therefore, how to simplify the circuit structure becomes a problem to be solved.

SUMMARY

In view of the above, an array substrate, a manufacturing method of an array substrate, and a display panel including the array substrate are provided by the present disclosure.

An array substrate is provided according to the present disclosure. The array substrate includes a substrate, a first active layer of a first thin film transistor, a first insulating layer, a first metal layer and a second active layer of a second thin film transistor.

The first active layer is located on the substrate, and includes a channel region, and a source contact region and a drain contact region located on two sides of the channel region.

The first insulating layer is located on the first active layer.

The first metal layer is located on the first insulating layer. The first metal layer includes a first connection portion. The first connection portion overlaps one of the source contact region or the drain contact region of the first active layer.

The second active layer is located on the first insulating layer and the first connection component, and includes a channel region, and a source contact region and a drain contact region located on two sides of the channel region. The first connection portion overlaps one of the source contact region or the drain contact region of the second active layer.

The one of the source contact region or the drain contact region of the first active layer overlaps the one of the source contact region or the drain contact region of the second active layer, and the one of the source contact region or the drain contact region of the first active layer and the one of the source contact region or the drain contact region of the second active layer are electrically connected through the first connection portion and a via in the first insulating layer.

The present disclosure further provides a display panel. The display panel includes the above array substrate.

The present disclosure further provides a manufacturing method of an array substrate. The method includes the steps described below.

A substrate is provided.

A first active layer of a first thin film transistor is formed on one side of the substrate. The first active layer includes a channel region, and a source contact region and a drain contact region located on two sides of the channel region.

A first insulating layer is formed on one side, away from the substrate, of the first active layer. A first via exposing one of the source contact region or the drain contact region of the first active layer is formed in the first insulating layer.

A first metal layer is formed on one side, away from the substrate, of the first insulating layer.

The first metal layer is patterned so that a first connection portion is formed at least. The first connection portion overlaps the one of the source contact region or the drain contact region of the first active layer, and contacts the one of the source contact region or the drain contact region of the first active layer through the first via.

A second active layer of a second thin film transistor is formed on one side, away from the substrate, of the first metal layer. The second active layer includes a channel region, and a source contact region and a drain contact region located on two sides of the channel region. The first connection portion overlaps one of the source contact region or the drain contact region of the second active layer.

According to the present disclosure, the manufacturing process can be simplified, and more circuit space can be saved.

DETAILED DESCRIPTION

Figure 1:
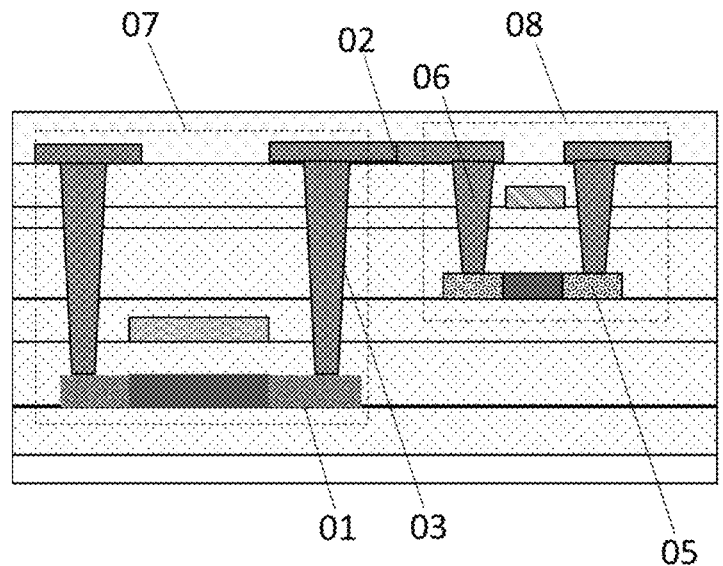
FIG. 1 is a schematic diagram of an array substrate according to the related arts.

Embodiments of the present disclosure will be further described below in conjunction with the drawings and disclosure.

It is to be noted that details are set forth below to facilitate a thorough understanding of the present disclosure. However, the present disclosure may be implemented by various embodiments different from the embodiments described herein. Therefore, the present disclosure is not limited to the embodiments disclosed below.

The terms used in the embodiments of the present disclosure are merely for the purpose of describing embodiments, rather than limiting the present disclosure. The terms "a", "an", "the" and "said" in a singular form in the embodiments of the present disclosure and the attached claims are also intended to include plural forms thereof, unless noted otherwise.

It is to be noted that spatially related terms, including "on", "below", "left" and "right" used in the embodiments of the present disclosure, are described from the perspective of the drawings, and are not to be construed as a limitation to the present disclosure. In addition, in the context, it is to be understood that when a component is formed "on" or "below" another component, the component may not only be directly formed "on" or "below" another component, and may also be indirectly formed "on" or "below" another component via an intermediate component.

However, exemplary embodiments may be implemented in many different forms and are not be construed as limited to the embodiments set forth herein; rather, these embodiments are provided so that this disclosure will be thorough and complete, and will fully convey the concept of the exemplary embodiments. The same reference numerals in the drawings denote the same or similar structures, and thus a description of the same reference numerals will not be repeated. The words expressing positions and orientations as used herein are illustrated in the drawings, but may be modified as desired and are intended to be encompassed within the scope of the disclosure. The drawings of the present disclosure are used for illustrating only the relative positional relationship. The layer thickness of a part is marked using the showy drawing method to facilitate understanding. The layer thickness in the drawings does not represent the ratio of the actual layer thickness. If not conflicted, the embodiments herein and the features thereof may be combined with each other. The drawings of the various embodiments in this application are given the same reference numerals. In addition, the same parts of the various embodiments will not be described again.

FIG. 1 is a structural diagram of an array substrate according to the related arts. The array substrate includes circuit structures, and each circuit structure includes thin film transistors. In one embodiment, as shown in FIG. 1, each circuit structure includes two thin film transistors 07 and 08, which are electrically connected. The inventor finds that since the active layers 01 and 05 of the two thin film transistors are located in different layers, if the active layers 01 and 05 of the two thin film transistors need be electrically connected, then a bridge 02 needs be disposed. In one embodiment, a via 03 exposing the active layer 01, and a via 06 exposing the active layer 05 need be disposed; and then the active layer 01 exposed by the via 03 and the active layer 05 exposed by the via 06 are electrically connected through the bridge 02. However, since the vias and the bridge occupy a space, especially the case where active layers of different thin film transistors are exposed by two vias, the available space in the array substrate is smaller.

Figure 2:
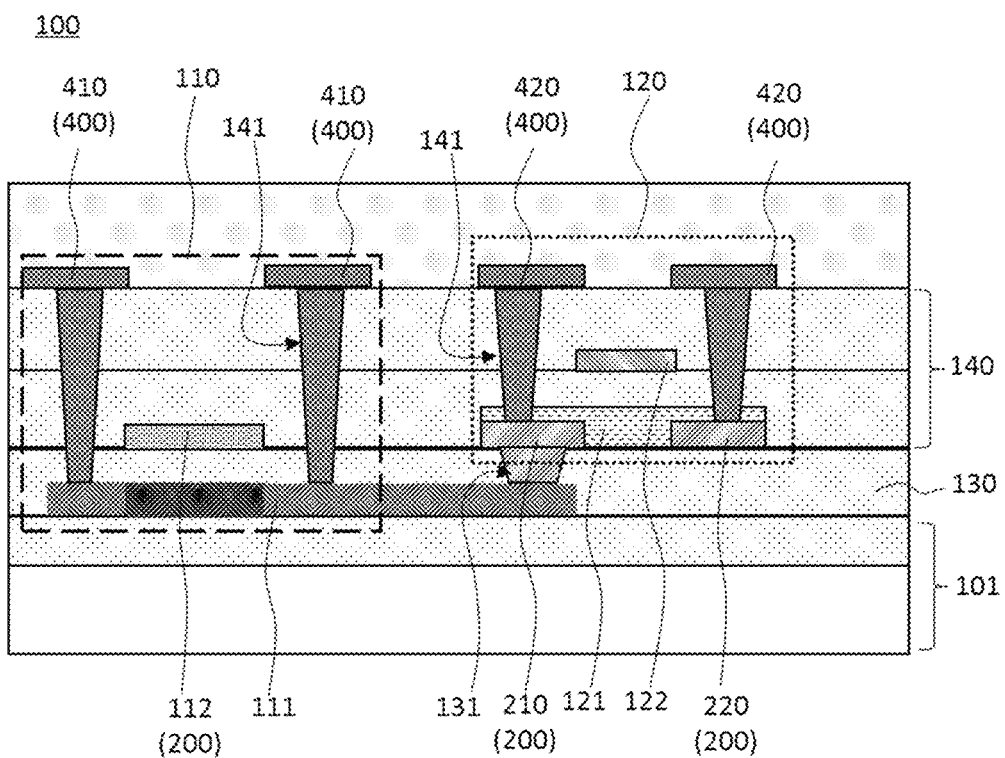
FIG. 2 is a schematic diagram of an array substrate according to an embodiment of the present disclosure.

In view of the above, the present disclosure provides an array substrate. FIG. 2 is a structural diagram of an array substrate according to an embodiment of the present disclosure. It can be understood that the structural diagram is a sectional view of the array substrate, where the section is perpendicular to the plane in which the array substrate is positioned.

As shown in FIG. 2, the array substrate 100 includes a substrate 101.

In one embodiment, the substrate 101 may be formed from a polymer material such as glass, polyimide (PI), polycarbonate (PC), polyether sulfone (PES), polyethylene terephthalate (PET), polyethylene naphthalate (PEN), polyarylate (PAR), glass fiber reinforced plastic (FRP) or the like. The substrate 101 may be transparent, translucent or opaque. In the embodiments of the present disclosure, the substrate 101 may also be a flexible substrate made from a polymer with a relative small thickness, for example, polyimide. The substrate 101 may further include a buffer layer. The buffer layer may include a stacked structure of multiple inorganic layers and organic layers to block oxygen and moisture and prevent moisture or impurities from permeating into the substrate. The buffer layer provides a flat surface on the upper surface of the substrate. The detailed structure will not be described in the present disclosure.

The array substrate 100 further includes an array layer. The array layer includes thin film transistors (TFTs). A pixel circuit composed of the thin film transistors is configured to control an organic light-emitting device. In the embodiment of the present disclosure, a structure of a top-gate type thin film transistor is described below.

In one embodiment, the array substrate 100 includes a first active layer 111 of a first thin film transistor 110. The first active layer 111 is on the substrate 101. In one or more embodiments, the first active layer 111 is formed on the buffer layer of the substrate 101. The first active layer 111 includes a channel region, a source contact region and a drain contact region, where the source contact region and the drain contact region are positioned on two sides of the channel region. In one embodiment, the active layer includes the source contact region and the drain contact region, which are doped with N-type impurity ions or P-type impurity ions, and the channel region positioned between the source contact region and the drain contact region.

The array substrate 100 further includes a first insulating layer 130 disposed on the first active layer 111.

The array substrate 100 further includes a first metal layer 200 disposed on the first insulating layer 130. The first metal layer 200 includes a first connection portion 210, which overlaps one of the source contact region or the drain contact region of the first active layer 111.

In one or more embodiments, the first metal layer 200 may be made of one or more of Mo, Ti or Al.

The array substrate 100 further includes a second active layer 121 of a second thin film transistor 120, and the second active layer 121 is disposed on the first insulating layer 130 and the first connection portion 210.

The second active layer 121 includes a channel region, a source contact region and a drain contact region, where the source contact region and the drain contact region are positioned on two sides of the channel region. The same embodiments of the second active layer 121 as the first active layer 111 will not be repeated.

In one or more embodiments, the first connection portion 210 overlaps one of the source contact region or the drain contact region of the first active layer 111. In other words, the orthographic projection of the first connection portion 210 onto the plane in which the array substrate 100 is located overlaps the orthographic projection of the source contact region of the first active layer 111 of the first thin film transistor 110 onto the plane in which the array substrate 100 is located, or the orthographic projection of the first connection portion 210 onto the plane in which the array substrate 100 is located overlaps the orthographic projection of the drain contact region of the first active layer 111 of the first thin film transistor 110 onto the plane in which the array substrate 100 is located.

In one or more embodiments, the first connection portion 210 overlaps and directly contacts one of the source contact region or the drain contact region of the second active layer 121. That is, the drain contact region of the second active layer 121 covers and contacts the first connection portion 210, or the source contact region of the second active layer 121 covers and contacts the first connection portion 210.

In one or more embodiments, one of the source contact region or the drain contact region of the first active layer 111 overlaps one of the source contact region or the drain contact region of the second active layer 121, and is electrically connected to the first connection portion 210 through a via 131 in the first insulating layer 130.

In other words, the orthographic projection of the source contact region or the drain contact region of the first active layer 111, the orthographic projection of the source contact region or the drain contact region of the second active layer 121, and the orthographic projection of the first connection portion 210 onto the plane of the array substrate 100 is located overlap each other. The first connection portion 210 fills the via 131 penetrating through the first insulating layer 130, and one of the source contact region or the drain contact region of the first active layer 111 is electrically connected to one of the source contact region or the drain contact region of the second active layer 121.

It should be understood that in this embodiment, the second source and drain electrodes are not directly contacted to the first active layer, but are indirectly connected to the first active layer through the first connection portions.

It needs be noted that in the present disclosure, the via is filled with a conductive material covering the via, and which will not be repeated hereinafter.

According to the present disclosure, the two thin film transistors are electrically connected by their source and drain. Meanwhile, since the orthographic projection of one of the source contact region or the drain contact region of the first active layer 111, the orthographic projection of one of the source contact region or the drain contact region of the second active layer 121, and the orthographic projection of the first connection portion 210 onto the plane of the array substrate 100 is located overlap each other, the conductive connection component (that is, the first connection portion) for connecting the two thin film transistors does not need occupy extra area of the array substrate. Moreover, the first connection portion is directly covered by the second active layer, and no other film layer needs be added between the second active layer and the first connection portion, which facilitates the thinning of the array substrate, and while the picture quality is ensured, the manufacturing process is simplified, and more circuit space can be saved.

With continued reference to FIG. 2, in some embodiments of the present disclosure, the first thin film transistor 110 of the array substrate 100 further includes a first gate electrode 112 overlapping the channel region of the first active layer 111, where the first gate electrode 112 is located on the first insulating layer 130. In one embodiment, the first gate electrode 112 may be made of one or more of Mo, Ti or Al.

In one or more embodiments, the first gate electrode 112 and the first connection portion are insulated from each other, but are in a same layer and made of a same material. That is, both the first connection portion 210 and the first gate electrode 112 of the first thin film transistor 110 are located in the first metal layer 200. The first connection portion 210 and the first gate electrode 112 of the first thin film transistor 110 are conductive patterns which are spaced apart or insulated from each other, and formed through a same patterning procedure (for example, etching) on the metal material of the first metal layer 200. Therefore, the number of the films in the array layer can be reduced, which facilitates the thinning of the array substrate.

In one or more embodiments, the array substrate 100 further includes a second insulating layer 140 on the second active layer 121. It should be understood that the insulating layer in the present disclosure, for example, the first insulating layer 130 or the second insulating layer 140, may be a gate insulating layer or interlayer insulating layer, and may be an inorganic insulating layer made of silicon oxide, silicon nitride, or the like. In one embodiment, the insulating layer is an organic insulating layer.

In one or more embodiments, the second insulating layer 130 further includes a first sub-layer, a second sub-layer, and a second gate electrode 122 of the second thin film transistor 120. The first sub-layer and the second sub-layer are stacked along a direction perpendicular to the plane in which the array substrate is located, and the second gate electrode 122 of the second thin film transistor 120 is between the first sub-layer and the second sub-layer. In one embodiment, the second gate electrode 122 overlaps the channel region of the second active layer 121, and is made of a metal material, which may be one or more of Mo, Ti or Al. The same embodiments of the second gate electrode 122 and the first gate electrode 112 will not be repeated.

It should be understood that the second thin film transistor in the present disclosure is of a top-gate structure, and in other embodiments of the present disclosure, the second gate electrode may be on one side, facing the substrate, of the second active layer, that is, the second thin film transistor is in a bottom-gate structure. In addition, the first thin film transistor also may be in the top-gate structure or bottom-gate structure, which will not be described in detail.

In one or more embodiments, the array substrate 100 further includes a second metal layer 400 located on the second insulating layer 140. The second metal layer 400 includes a second source/drain electrode 420 overlapping at least one of the source contact region or the drain contact region of the second active layer 121. The second source/drain electrode is electrically connected to one of the source contact region or the drain contact region of the second active layer 121 through a via 141 in the second insulating layer 140.

In one embodiment, the second metal layer 400 on the second insulating layer 130 includes the source electrode and the drain electrode of the second thin film transistor 120, which are spaced apart from each other and obtained through patterning. Hereinafter, the source electrode and the drain electrode of the second thin film transistor 120 are referred to as a second source electrode and a second drain electrode, respectively. The orthographic projection of the second source electrode onto the plane in which the array substrate 100 is located overlaps the orthographic projection of the source contact region of the second active layer 121 onto the plane in which the array substrate 100 is located, and the orthographic projection of the second drain electrode onto the plane in which the array substrate 100 is located overlaps the orthographic projection of the drain contact region of the second active layer 121 onto the plane in which the array substrate 100 is located. At least one via 141 penetrates through the second insulating layer 140, and exposes the drain contact region of the second active layer 121, so that the second drain electrode contacts the drain contact region of the second active layer 121. At least another via 141 penetrates through the second insulating layer 140, and exposes the source contact region of the second active layer 121, so that the second source electrode contacts the source contact region of the second active layer 121.

In one or more embodiments, the second metal layer 400 may be made of one or more of Mo, Ti or Al.

In one or more embodiments, the second source/drain electrode 420 overlaps the first connection portion 210, and the second source/drain electrode 420 is electrically connected to the first connection portion 210 through a via in the one of the source contact region or the drain contact region of the second active layer 121.

In one embodiment, the orthographic projection of one of the second source electrode or the second drain electrode onto the plane in which the array substrate 100 is located overlaps the orthographic projection of the first connection portion 210 onto the plane in which the array substrate 100 is located. The first connection portion 210 overlaps one of the second source electrode or the second drain electrode; and meanwhile, the first connection portion 210 is exposed by a via that penetrates through the source contact region or the drain contact region of the second active layer 121 covering the first connection portion 210, so that the first connection portion 210 contacts one of the second source electrode and the second drain electrode which overlaps the first connection portion 210.

It should be understood that which one of the second source electrode or the second drain electrode specially overlaps, or is connected to the first connection portion 210 depends on whether the first connection portion is covered by the drain contact region of the second active layer 121 or the source contact region of the second active layer 121. If the first connection portion is covered by the drain contact region of the second active layer 121, then the first connection portion 210 overlaps the second drain electrode. If the first connection portion is covered by the source contact region of the second active layer 121, then the first connection portion 210 overlaps the second source electrode. In other embodiments of the present disclosure, the present disclosure is not limited to the above.

It should be understood that which one of the source electrode or the drain electrode of the first thin film transistor is electrically connected to which one of the source electrode or the drain electrode of the second thin film transistor is not limited in the present disclosure, and may be set according to need. For example, the orthographic projection of the source electrode of the first thin film transistor, the orthographic projection of the drain electrode of the second thin film transistor, the orthographic projection of the source contact region of the first thin film transistor, the orthographic projection of the drain contact region of the second thin film transistor, and the orthographic projection of first connection portion, onto the plane in which the array substrate is located, overlap each other. The source electrode of the first thin film transistor is connected to the drain electrode of the second thin film transistor through the first connection portion. In one or more embodiments, the source electrode of the first thin film transistor and the drain electrode of the second thin film transistor are in the second metal layer, and are spaced apart from each other, that is, the source electrode of the first thin film transistor and the drain electrode of the second thin film transistor are spaced apart from each other (where the drain electrode and the source electrode above-mentioned may be exchanged according to need).

In one or more embodiments, the second metal layer further includes a first source/drain electrode overlapping at least one of the source contact region or the drain contact region of the first active layer, and the first source/drain electrode is electrically connected to the one of the source contact region or the drain contact region of the first active layer through a via in the second insulating layer.

In one embodiment, the second metal layer 400 further includes the first source/drain electrode 400 overlapping at least the one of the source contact region or the drain contact region of the first active layer 111, and the first source/drain electrode 410 is electrically connected to the one of the source contact region or the drain contact region of the first active layer 111 through the via 141 in the second insulating layer 140. In one embodiment, the second metal layer 400 on the second insulating layer 130 includes the source electrode and the drain electrode of the first thin film transistor 110, which are spaced apart from each other and obtained by patterning. Hereinafter, the source electrode and the drain electrode of the first thin film transistor 110 are referred to as a first source electrode and a first drain electrode, respectively, where the same embodiments as the second thin film transistor will not be repeated.

It should be understood that in this embodiment, the source electrode and the drain electrode of the first thin film transistor as well as the source electrode and the drain electrode of the second thin film transistor may be in the same layer, that is, the second metal layer. Therefore, the number of the films in the array layer can be reduced, which facilitates the thinning of the array substrate.

In other embodiments of the present disclosure, the source electrode and the drain electrode of the first thin film transistor may be in a different layer from the source electrode and the drain electrode of the second thin film transistor.

In some embodiments of the present disclosure, the array layer further includes a passivation layer on the thin film transistor. In one embodiment, the passivation layer is on the source electrode and the drain electrode. The passivation layer may be an inorganic layer made of silicon oxide, silicon nitride or the like, or the passivation layer may be an organic layer.

It should be understood that which one of the source electrode or the drain electrode of the first thin film transistor is electrically connected to which one of the source electrode or the drain electrode of the second thin film transistor is not limited in the present disclosure, and may be set according to needs. For example, the orthographic projection of the source electrode of the first thin film transistor, the orthographic projection of the drain electrode of the second thin film transistor, the orthographic projection of the source contact region of the first thin film transistor, the orthographic projection of the drain contact region of the second thin film transistor and the orthographic projection of the first connection portion, onto the plane in which the array substrate 100 is located, overlap each other. The source electrode of the first thin film transistor and the drain electrode of the second thin film transistor are connected through the first connection portion, and are in the second metal layer. Meanwhile, the source electrode of the first thin film transistor and the drain electrode of the second thin film transistor are spaced apart from each other, that is, a distance exists between the source electrode of the first thin film transistor and the drain electrode of the second thin film transistor (where the drain electrode and the source electrode above-mentioned may be exchanged according to needs).

According to the present disclosure, the two thin film transistors are electrically connected by their the source and drain electrodes. Meanwhile, since the orthographic projection of one of the source contact region or the drain contact region of the first active layer 111, the orthographic projection of one of the source contact region or the drain contact region of the second active layer 121, and the orthographic projection of the first connection portion 210, onto the plane in which the array substrate 100 is located, overlap each other, the conductive connection component (that is, the first connection portion) for connecting the two thin film transistors does not occupy extra area of the array substrate. And the first connection portion is directly covered by the second active layer, and it does not need to add other film between the first connection portion and the second active layer, which facilitates the thinning of the array substrate. In addition, while the source/drain electrode of the first thin film transistor is electrically connected to the source/drain electrode of the second thin film transistor, the source/drain electrode of the first thin film transistor and the source/drain electrode of the second thin film transistor are spaced apart by a distance, which can avoid crosstalk caused by too close conductive components on one hand, can provide space for other wires or designs, and can provide reserved space for process deviation on the other hand. Therefore, while the picture quality is ensured, the manufacturing process is simplified, and more circuit space can be saved.

In some embodiments of the present disclosure, the first active layer and the second active layer are made of different materials. The first active layer is low temperature polysilicon, and the second active layer is an oxide semiconductor.

In one embodiment, the first active layer 111 may be made of low temperature poly silicon (LTPS), and the second active layer 121 may be made of an oxide semiconductor. The LTPS is suitable for manufacturing a panel driver with high resolution, and the drive circuit can be directly integrated on a glass substrate, so that the panel has the advantages of low power consumption, high aperture ratio, high resolution, high brightness and the like. Although the mobility of oxide semiconductor represented by indium gallium zinc oxide (IGZO) is lower than the mobility of LTPS, most of the oxide semiconductor materials are transparent and have good uniformity, and can be manufactured on a flexible substrate. In actual applications, the stability of the LTPS and the uniformity of the oxide semiconductor are both taken into consideration, and TFTs can be manufactured in appropriate positions by using different materials. In addition, other materials or the same material may be used to manufacture the first active layer and the second active layer, for example, both the first active layer and the second active layer may be made of the oxide semiconductor, and the choice for materials of the active layers is not specially limited in the embodiments of the present disclosure.

In one or more embodiments, the second active layer may be one of IGZO, ITZO, IGZTO, IGO or IAZO, or a combination of several of IGZO, ITZO, IGZTO, IGO and IAZO.

It needs be noted that since the LTPS is manufactured at a high temperature, the LTPS is generally formed on the bottom layer and the oxide semiconductor is generally formed on the LTPS, so that the manufacturing of the oxide semiconductor is not affected. In one embodiment, when the material of the first active layer in a lower layer is the low temperature poly-silicon semiconductor, the second active layer 121 is in a layer above the first active layer by using the oxide semiconductor, that is, the second active layer 121 is manufactured after the first active layer is formed.

In one or more embodiments, the first thin film transistor (that is, the thin film transistor in which the first active layer is low temperature poly silicon) is used as a driving transistor to be connected to a display element in a display panel to provide a driving signal to the display element.

According to the present disclosure, the source electrode and the drain electrode of the two thin film transistors are electrically connected, and meanwhile, since two different types of thin film transistors have different active layers, the active layers are in different film layers. As analyzed above, this not only facilitates circuit design and driving display, but also achieves that the orthographic projection of the one of the source contact region or the drain contact region of the first active layer, the orthographic projection of the one of the source contact region or the drain contact region of the second active layer, and the orthographic projection of the first connection portion, onto the plane in which the array substrate is located, overlap each other, and therefore, the conductive connection component (that is, the first connection portion) for connecting the two thin film transistors does not need occupy extra area of the array substrate. And the first connection portion is directly covered by the second active layer, and it does not need to arrange other film between the first connection portion and the second active layer, so that the thinning of the array substrate is facilitated. In addition, while the source/drain electrode of the first thin film transistor is electrically connected to the source/drain electrode of the second thin film transistor, a space can exist between the source/drain electrode of the first thin film transistor and the source/drain electrode of the second thin film transistor; and this space can avoid crosstalk caused by too close conductive components on one hand, and can provide space for other traces or designs and reserve space for process deviation on the other hand. Therefore, while the picture quality is ensured, the manufacturing process is simplified, and more circuit space can be saved.

In addition, the inventor finds that after the second insulating layer is formed, when a via corresponding to the position of the overlapping one among the source contact regions and the drain contact regions of the first active layer and the second active layer is directly manufactured, and the via penetrates the second active layer and exposes one of the source contact region or the drain contact region of the first active layer, in which case, the second source/drain electrode directly contacts the one of the source contact region or the drain contact region of the first active layer, in one embodiment, since the second source/drain electrode further needs penetrate the second active layer, while the second active layer is an etching-resistant substance because made of the oxide semiconductor material, if the etching strength is increased and the oxide semiconductor layer is etched through, then a corresponding via connecting the first active layer and the first source/drain electrode is over-etched; and in another embodiment, since the active layer corresponding to the via, that is, the oxide semiconductor material in the path of the via, needs be processed with acid, while the oxide semiconductor layer is particularly sensitive to acid, the formed aperture is larger than the target aperture, that is, the aperture penetrating the oxide semiconductor layer is larger than the apertures penetrating the first insulating layer and the second insulating layer, in which case, the second source/drain electrode cannot contact the second active layer and the problem of circuit connection occurs. According to this embodiment, instead of penetrating through the second active layer through second source/drain electrode, the linking through the first connection portion is taken, and the first connection portion is positioned on one side, facing the first active layer, of the second active layer, that is, the first connection portion is manufactured first and the second active layer is manufactured later, so that both the problem of over-etching and the above-mentioned problem of circuit connection can be avoided.

Figure 3:
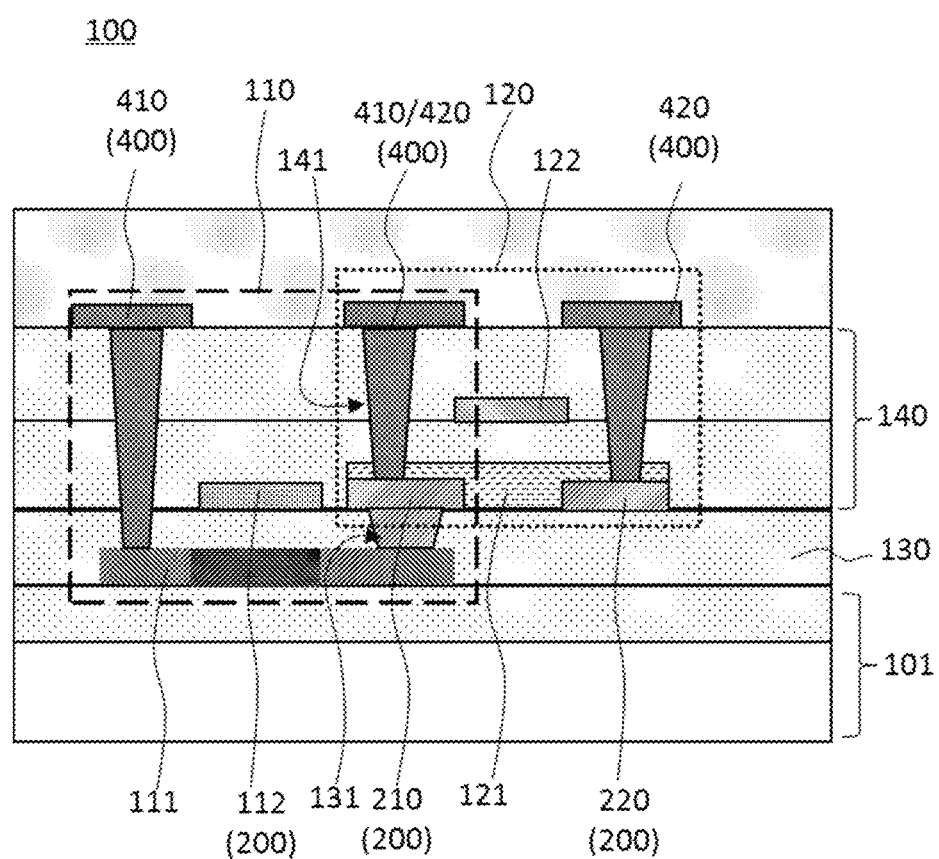
FIG. 3 is a schematic diagram of another array substrate according to an embodiment of the present disclosure.

FIG. 3 is a structural diagram of another array substrate according to an embodiment of the present disclosure. In some embodiments of the present disclosure, a second insulating layer 140 is no longer provided with a via corresponding to one, which needs be electrically connected to a second thin film transistor 120, of a source contact region or a drain contact region in a first active layer 111. Another element that needs be electrically connected to a source electrode or drain electrode of a first thin film transistor 110 is directly electrically connected to a corresponding source electrode or drain electrode of the second thin film transistor 120.

That is, the second source/drain electrode 420 is not directly contacted to the first source/drain electrode 410, but is indirectly connected to the first source/drain electrode 410 through a first connection portion 131; and the first source/drain 410 is multiplexed as the second source/drain 420.

According to the present disclosure, the source electrode and the drain electrode of the two thin film transistors are electrically connected, and meanwhile, since the orthographic projection of one of the source contact region or the drain contact region of the first active layer 111, the orthographic projection of one of the source contact region or the drain contact region of a second active layer 121, and the orthographic projection a first connection portion 210, onto the plane in which the array substrate 100 is located, overlap each other, a conductive connection component (that is, the first connection portion) for connecting the two thin film transistors does not need occupy extra area of the array substrate. And the connection portion is directly covered by the second active layer, and there is no need to add other film between the connection portion and the second active layer, so that the thinning of the array substrate is facilitated.

Further, the first source/drain 410 is multiplexed as the second source/drain 420, so there is no need to occupy an additional area in the first insulating layer 130 and the second insulating layer 140 for forming a via for connecting the first source/drain 410 and the first active layer 111. Furthermore, since the via for connecting the first source/drain 410 and the first active layer 111 needs to penetrate through both the first insulating layer 130 and the second insulating layer 140, this via penetrates through more films and has a larger depth compared with a via connecting the second active layer and the second source/drain 420, and thus occupies a larger area.

The present disclosure has the following benefits. In one embodiment, the second source/drain 420 is indirectly connected to the first active layer through the first connection portion, so that the depth of the via which needs be filled is reduced by one film layer, and the area occupied by the via is reduced. In another embodiment, the first source/drain electrode is multiplexed as the second source/drain electrode, so that one of the source electrode or drain electrode of the first thin film transistor, and a via connecting the source electrode or the drain electrode to an active layer are no longer needed, and a large space is saved for the array substrate. This space can avoid crosstalk caused by too close conductive components on one hand, and can provide space for other traces or designs and serve as reserved space for process deviation on the other hand. Therefore, while the picture quality is ensured, the manufacturing process is simplified, and more circuit space can be saved.

In addition, since the first active layer is low temperature poly silicon, the source contact region and the drain contact region of the first active layer need be processed with HF. In one embodiment, first a via exposing the source contact region or the drain contact region of the first active layer (for simplifying the process, the via is used for connecting the source/drain electrode to the source/drain contact region in this embodiment) is formed, and then the source/drain contact region exposed by the via is processed with HF acid. The inventor finds that if the first connection portion is manufactured after the second active layer, then the via for exposing the source/drain contact region of the first active layer is formed by etching after the second active layer is formed. Since HF acid process is performed before the formation of the first connection portion, the second active layer is etched away, and a circuit problem is resulted.

According to this embodiment, connection is implemented through the first connection portion, and the first connection portion is on one side, facing the first active layer, of the second active layer, that is, the first connection portion is manufactured first and the second active layer is manufactured later, so that problem that the electrical performance of the conductive film is affected by the process of another film can be avoided.

Figure 4:
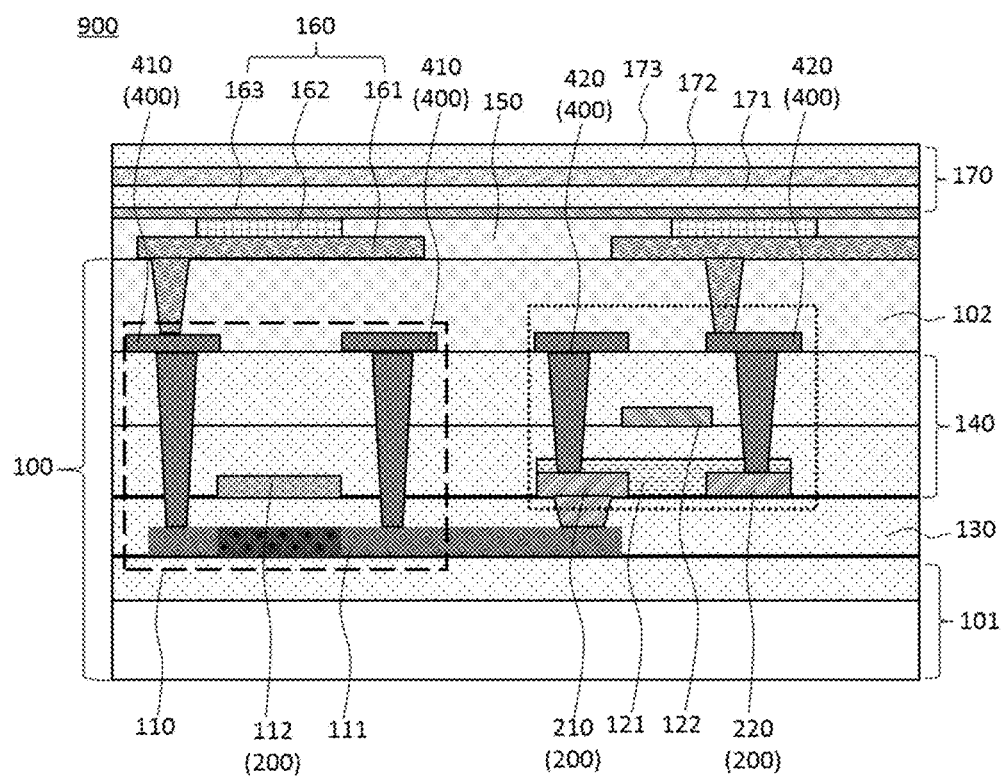
FIG. 4 is a schematic diagram of a display panel according to an embodiment of the present disclosure.

FIG. 4 is a structural diagram of another array substrate according to some embodiments of the present disclosure. The display panel 900 includes an array substrate 100 described in the present disclosure.

In one or more embodiments, the display panel 900 further includes a planarization layer 102 located on a source electrode or drain electrode or the passivation layer of the array substrate 100. In one embodiment, the planarization layer 102 may include an organic layer made of acryl, polyimide (PI), benzocyclobutene (BCB) or the like; and the planarization layer 102 has a planarization function.

In one or more embodiments, the display panel 900 is an organic light-emitting display panel, and further includes a display function layer located on one side, away from a substrate 101, of the array substrate 100. In one embodiment, the display function layer is on the planarization layer 102; and the display function layer includes a pixel definition layer 150, and an organic light-emitting device 160 defined by the opening of the pixel definition layer 150. In one embodiment, the organic light-emitting device 160 includes an anode 161, an organic light-emitting material 162 and a cathode 163 sequentially disposed along a direction away from the substrate 101. The anode 161 includes anode patterns in one-to-one correspondence with the pixel units, and each of the anode patterns in the anode 161 is connected to a source electrode or a drain electrode of a corresponding thin film transistor through a via in the planarization layer 102.

In one or more embodiments, the display panel 900 may further include: an encapsulation layer 170 (that is, a thin film encapsulation (TFE) layer). The encapsulation layer 170 is on one side, facing away from the array substrate 100, of the display function layer, and completely covers the organic light-emitting device 160 to seal the organic light-emitting device 160.

In one or more embodiments, the encapsulation layer 170 is on the cathode, and includes a first inorganic encapsulation layer 171, a first organic encapsulation layer 172 and a second inorganic encapsulation layer 173 sequentially disposed along the direction away from the substrate. In other embodiments of the present disclosure, the encapsulation layer may include any number of stacked layers made of organic material or inorganic material according to needs, but includes at least one organic material layer and at least one inorganic material layer alternately disposed with the at least one organic material layer, and the lowermost layer and the uppermost layer are made of inorganic material.

In some embodiments of the present disclosure, the display panel may be a liquid crystal display panel. The display panel further includes a color film substrate disposed opposite to the array substrate provided in the present disclosure, and a liquid crystal layer between the array substrate and the color film substrate.

Figure 5:
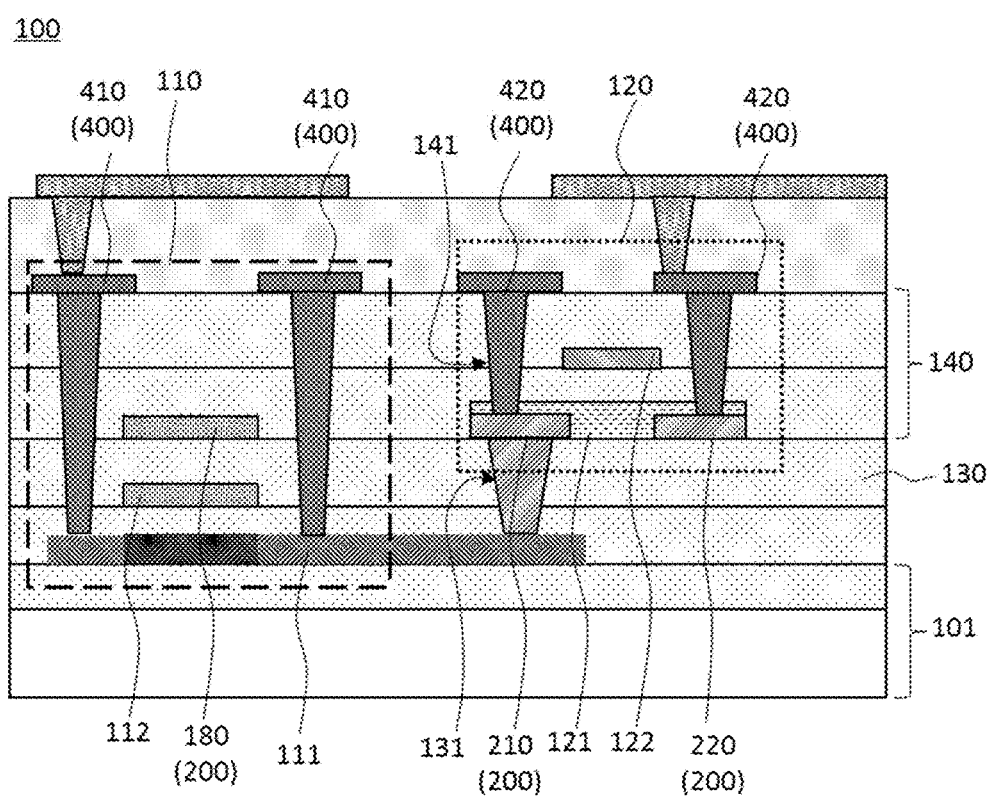
FIG. 5 is a schematic diagram of another array substrate according to an embodiment of the present disclosure.

FIG. 5 is a structural diagram of another array substrate according to an embodiment of the present disclosure. The same embodiments of this embodiment as the above-mentioned embodiments will not be repeated.

Differently, the array substrate 100 further includes a gate insulating layer on a first active layer 111, a first insulating layer 130, and a first metal layer 200. A first gate electrode 112 is on the gate insulating layer, and overlaps a channel region of the first active layer 111.

The first insulating layer 130 is on one side, away from a substrate 101, of the first gate electrode 112.

The first metal layer 200 is on the first insulating layer 130, and includes a first connection portion 210 overlapping one of a source contact region or a drain contact region of the first active layer 111.

The array substrate 100 further includes a second active layer 121 of a second thin film transistor 120. The second active layer 121 is on the first insulating layer 130 and the first connection portion 210.

In other words, the first active layer 111, the gate insulating layer, the first gate electrode 112, the first insulating layer 130, the first metal layer 200, the second active layer 121, a first sub-layer of a second insulating layer 140, a second gate electrode 122, a second sub-layer of the second insulating layer 140 and a second metal layer 400 are sequentially stacked along a direction away from the substrate 101.

In one or more embodiments, the array substrate 100 further includes a capacitor electrode 180 located on the first insulating layer 130. The capacitor electrode 180 and the first connection portion 210 are insulated from each other, but are in the same layer and made of the same material. That is, the capacitor electrode 180 is in the first metal layer 200, and the capacitor electrode 180 and the first connection portion 210 are conductive patterns, which are spaced apart or insulated from each other, and formed in the same patterning process (for example, etching) performed on the metal material of the first metal layer 200. Therefore, the number of the films in the array layer can be reduced, so that the thinning of the array substrate is facilitated.

In this embodiment, the orthographic projection of the capacitor electrode 180 onto the plane where the array substrate 100 is located and the orthographic projection of the first gate electrode 112 onto the plane where the array substrate 100 is located overlap each other, so that a capacitor is formed.

It should be understood that the capacitor electrode 180 is one electrode of a capacitor of a circuit in the array substrate 100, and the other electrode of the capacitor may be in the same layer as another conductive layer in the array substrate 100, such as a gate layer, a source/drain electrode layer or the like, which is not limited in this disclosure.

Figure 6:
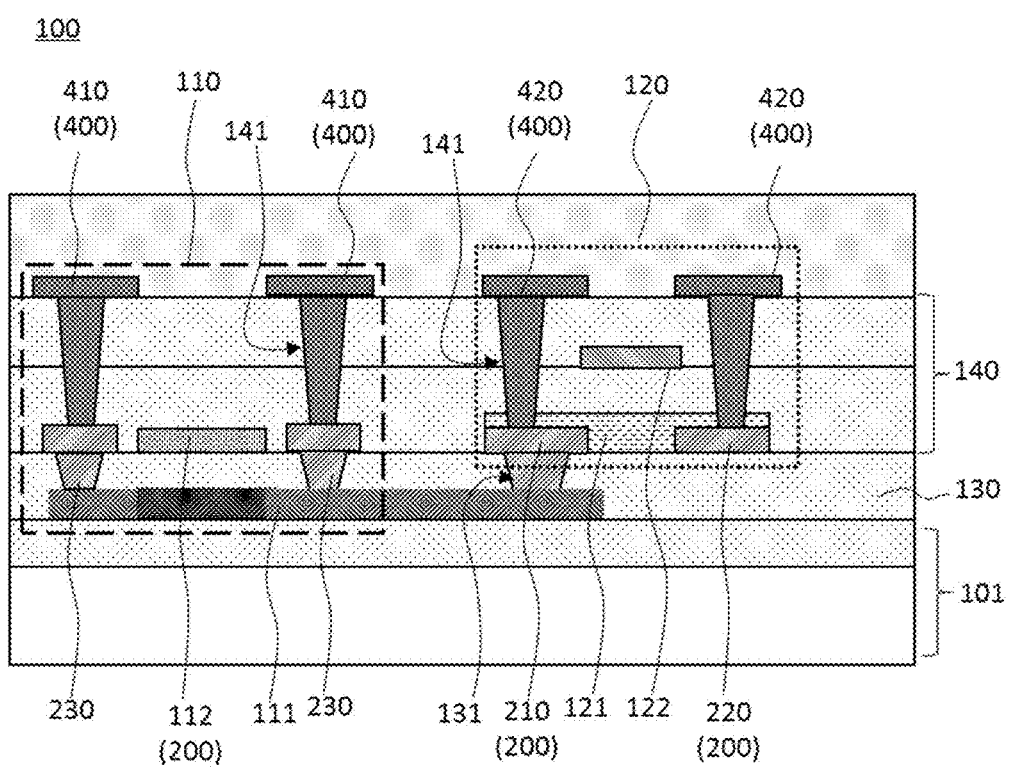
FIG. 6 is a schematic diagram of another array substrate according to an embodiment of the present disclosure.

FIG. 6 is a structural diagram of another array substrate according to an embodiment of the present disclosure. As shown in FIG. 6, a first metal layer 200 further includes a second connection portion 230. The second connection portion 230 overlaps at least one of a source contact region or a drain contact region of a first active layer 111, and is electrically connected to the one of the source contact region or the drain contact region of the first active layer 111 through a via in a first insulating layer 130.

In one embodiment, the second connection portion 230 and a first connection portion 210 are conductive patterns, which are spaced apart or insulated from each other, and formed in the same patterning process (for example, etching) on the metal material of the first metal layer 200. In one embodiment, the first metal layer 200 includes second connection portions 230.

In one or more embodiments, the array substrate 100 further includes a second insulating layer 140 on a second active layer 121.

In one or more embodiments, the array substrate 100 further includes a first source/drain electrode 410 overlapping at least one source/drain contact region of the first active layer 111. In one embodiment, the first source/drain electrode 410 and a second source/drain electrode 420 are in the same layer and made of the same material, that is, a second metal layer 400 on a second insulating layer 140 includes the source electrode and the drain electrode of a first thin film transistor 110, which are obtained through patterning and spaced apart from each other. The source electrode and the drain electrode of the first thin film transistor 110 are referred to as a first source electrode and a first drain electrode, respectively. The first source electrode is in contact with the second connection portion 230 of the corresponding source contact region through a via 140 in the second insulating layer 140, and the first drain electrode is in contact with the second connection portion 230 of the corresponding drain contact region through a different via 140 in the second insulating layer 140, and the first source electrode is electrically connected to the source contact region of the first active layer 111 through the second connection portion 230, and the first drain electrode is electrically connected to the drain contact region of the first active layer 111 through the second connection portion 230.

In one or more embodiments, a first gate electrode 112 of the first thin film transistor 110 is also in the first metal layer 200. In one or more embodiments, along a direction parallel to the plane in which the array substrate 100 is positioned, the second connection portion 230 connected to the second source electrode and the second connection portion 230 connected to the second drain electrode are positioned on two sides of the first gate electrode 112.

In one or more embodiments, the first active layer and the second active layer are made of different materials. For example, the first active layer is made of low temperature poly silicon, and the second active layer is made of an oxide semiconductor.

The present disclosure has the following benefits. In one embodiment, the source and drain electrodes of the two thin film transistors are electrically connected, and the orthographic projection of one of the source contact region or the drain contact region of the first active layer 111, the orthographic projection of one of a source contact region or a drain contact region of a second active layer 121, and the orthographic projection of the first connection portion 210, onto the plane in which the array substrate 100 is located, overlap each other, so the conductive connection component (that is, the first connection portion) for connecting the two thin film transistors does not need occupy extra area of the array substrate. In addition, the first connection portion is directly covered by the second active layer, so there is no need to add other film between the first connection portion and the second active layer, and the thinning of the array substrate is facilitated. In addition, while the source/drain electrode of the first thin film transistor is electrically connected to the source/drain electrode of the second thin film transistor, a space can exist between the source/drain electrode of the first thin film transistor and the source/drain electrode of the second thin film transistor. This space can avoid crosstalk caused by too close conductive components on one hand, and can provide space for other traces or designs and space reserved for process deviation on the other hand. Therefore, while the image quality is ensured, the manufacturing process is simplified, and more circuit space can be saved.

In another embodiment, since the first active layer is made of low temperature poly silicon, it needs to process the source contact region and the drain contact region of the first active layer with HF. In one embodiment, first a via exposing the source contact region and a via exposing the drain contact region of the first active layer (for simplifying the process, the vias are used to connect the source electrode and the drain electrode to the source contact region and the drain contact region in this embodiment) is formed, and then the source contact region and the drain contact region exposed by the vias are processed with HF acid. The inventor finds that if the first connection portion is formed after the second active layer, then the via exposing the source contact region or the drain contact region is formed by etching after the second active layer is formed. Since HF acid process is performed before the first connection portion is formed, the second active layer is etched, and a circuit problem is resulted.

According to this embodiment, the second connection portion is formed before the second active layer is formed, and the source contact region and the drain contact region of the first active layer are connected to the source electrode and the drain electrode through second connection portions respectively, so that the problem that the second active layer is affected by the process of another film can be avoided. Since the second connection portion and the first connection portion are in the same layer and made of the same material, the connection performance (particularly the electrical contact performance) of the first thin film transistor is improved without adding any film 1, so that the process is simplified.

Figure 7:
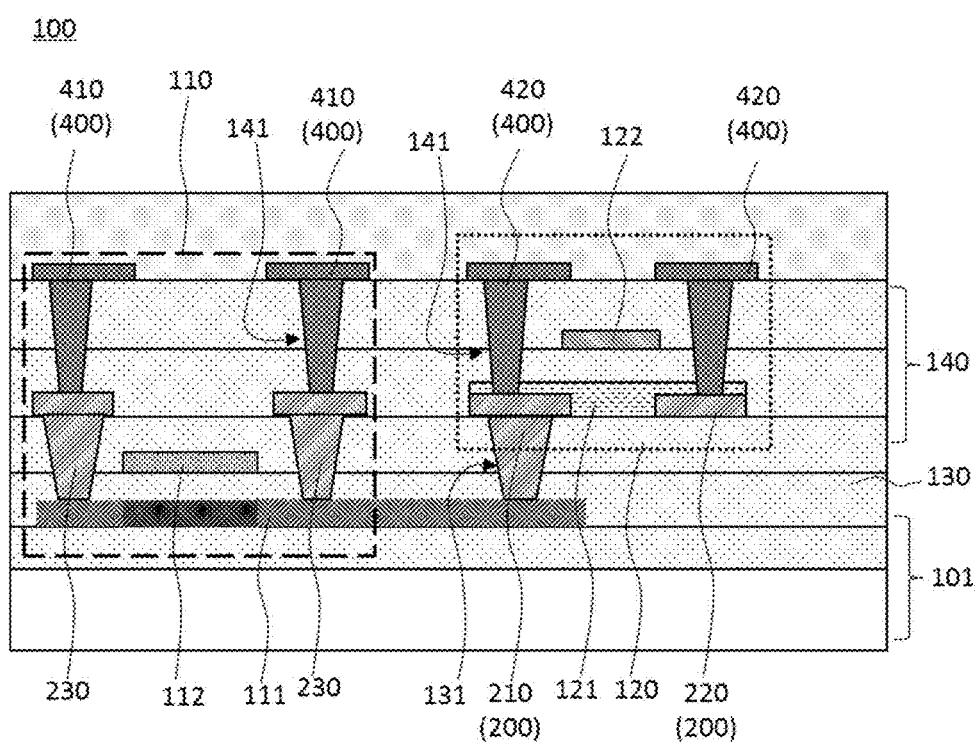
FIG. 7 is a schematic diagram of another array substrate according to an embodiment of the present disclosure.

FIG. 7 is a structural diagram of another array substrate according to an embodiment of the present disclosure. The same embodiments of this embodiment as the above-mentioned embodiments will not be repeated.

Differently, a first active layer 111, a gate insulating layer, a first gate electrode 112, a first insulating layer 130, a first metal layer 200, a second active layer 121, a first sub-layer of a second insulating layer 140, a second gate electrode 122, a second sub-layer of the second insulating layer 140 and a second metal layer 400 are sequentially stacked along a direction away from a substrate 101.

The first metal layer 200 further includes a second connection portion 230. The second connection portion 230 overlaps at least one of a source contact region or a drain contact region of the first active layer 111, and is electrically connected to the one of the source contact region or the drain contact region of the first active layer 111 through a via in the first insulating layer 130 and a via in the gate insulating layer.

In one or more embodiments, the array substrate 100 further includes a capacitor electrode (not shown in FIG. 7, reference may be made to the structures shown in FIG. 7 and FIG. 5 in combination) on the first insulating layer 130. The capacitor electrode 180 and the first connection portion 210 are insulated from each other, but are in the same layer and made of the same material. That is, the capacitor electrode 180 is in the first metal layer 200. The capacitor electrode 180 and the first connection portion 210 are conductive patterns, which are spaced apart or insulated from each other, and formed in the same patterning process (for example, etching) on the metal material of the first metal layer 200. Therefore, the number of the film layers in the array layer can be reduced, so that the thinning of the array substrate is facilitated.

In one or more embodiments, the capacitor electrode is also in the first metal layer. In one embodiment, along a direction parallel to the plane in which the array substrate is positioned, the second connection portion connected to the second source electrode and the second connection portion connected to the second drain electrode are positioned on two sides of the capacitor electrode.

In other embodiments of the present disclosure, the second connection component is positioned in another conductive layer, so long as the second connection component is formed before the active layer made of oxide semiconductor.

According to the present disclosure, in one embodiment, the source and drain electrodes of the two thin film transistors are electrically connected. In addition, since the orthographic projection of one of the source contact region or the drain contact region of the first active layer, the orthographic projection of one of a source contact region or a drain contact region of a second active layer, and the orthographic projection of the first connection portion, onto the plane in which the array substrate is positioned, overlap each other, a conductive connection component (that is, the first connection portion) for connecting the two thin film transistors does not need occupy extra area of the array substrate. The first connection portion is directly covered by the second active layer, and no other film layer needs be added there between, so that the thinning of the array substrate is facilitated. In addition, while the source/drain electrode of the first thin film transistor is electrically connected to the source/drain electrode of the second thin film transistor, a space exists between the source/drain electrode of the first thin film transistor and the source/drain electrode of the second thin film transistor; and this space can avoid crosstalk caused by too close conductive components on one hand, and can provide space for other traces or designs and space reserved for process deviation on the other hand. Therefore, while the picture quality is ensured, the manufacturing process is simplified, and more circuit space can be saved.

In another embodiment, since the first active layer is made of low temperature poly silicon, it needs to process the source contact region and the drain contact region of the first active layer with HF. In one embodiment, first vias exposing the source contact region and the drain contact region of the first active layer (for simplifying the process, the vias are used for connecting the source and drain electrodes to the source contact region and the drain contact region in this embodiment) are formed, and then the source contact region and the drain contact region exposed by the vias are processed with HF acid. The inventor finds that if the first connection portion is formed after the second active layer, then the vias for exposing the source contact region and the drain contact region are formed by etching after the second active layer is formed. Since HF acid process is performed before the first connection portion is formed, the second active layer is etched, and a circuit problem is resulted.

According to this embodiment, the second connection portion is formed before the second active layer is formed, and the source contact region and the drain contact region of the first active layer are connected to the source electrode and the drain electrode through second connection portions, respectively, so that the problem that the second active layer is affected by the process of another film can be avoided. Further, since the second connection portion and the first connection portion are in the same layer and made of the same material, the connection performance (particularly the electrical contact performance) of the first thin film transistor is improved without adding any film, so that the process is simplified.

With reference to any embodiment shown in FIG. 2 to FIG. 7, in some embodiments of the present disclosure, the first metal layer further includes a first auxiliary portion 220. In one embodiment, the first auxiliary portion 220 overlaps and directly contacts the one of the source contact region and the drain contact region of the second active layer 121 which is not in contact with the first connection portion 210.

In one embodiment, both the first auxiliary portion 220 and the first connection portion 210 are in the first metal layer 200. The first auxiliary portion 220 and the first connection portion 210 are conductive patterns which are spaced apart or insulated from each other, and are formed in the same patterning process (for example, etching) on the metal material of the first metal layer 200. Therefore, the number of the film layers in the array layer can be reduced, so that the thinning of the array substrate is facilitated.

One of the drain contact region and the source contact region of the second active layer 121 covers and contacts the first connection portion 210, and the other one of the drain contact region and the source contact region of the second active layer 121 covers and contacts the first auxiliary portion 220.

In one or more embodiments, one of the drain contact region and the source contact region of the second active layer 121 includes a via exposing the first auxiliary portion 220, and the other one of the drain contact region and the source contact region of the second active layer 121 includes a via exposing the first connection portion 210. One of the second source electrode and the second drain electrode is electrically connected to the first connection portion 210 through the via in one of the source contact region and the drain contact region of the second active layer 121, and the other one of the second source electrode or the second drain electrode is electrically connected to the first auxiliary portion 220 through the via in the other one of the source contact region and the drain contact region of the second active layer 121.

According to the present disclosure, in one embodiment, the source and drain electrodes of the two thin film transistors are electrically connected. Meanwhile, since the orthographic projection of one of the source contact region and the drain contact region of the first active layer, the orthographic projection of one of the source contact region and the drain contact region of the second active layer, and the orthographic projection of the first connection portion, onto the plane in which the array substrate is located, overlap each other, the conductive connection component (that is, the first connection portion) for connecting the two thin film transistors does not need occupy extra area of the array substrate. Further, the first connection portion is directly covered by the second active layer, and no other film layer needs be added there between, so that the thinning of the array substrate is facilitated. Furthermore, while the source/drain electrode of the first thin film transistor is electrically connected to the source/drain electrode of the second thin film transistor, a space exists between the source/drain electrode of the first thin film transistor and the source/drain electrode of the second thin film transistor. This space can avoid crosstalk caused by too close conductive components on one hand, and can provide space for other traces or designs and reserve space for process deviation on the other hand. Therefore, while the picture quality is ensured, the manufacturing process is simplified, and more circuit space can be saved.

In addition, the conductive treatment of IGZO can be replaced by the first auxiliary portion that is connected to the second source/drain electrode through the via in the source or drain contact region of the second active layer; so that the contact performance of the source/drain electrode and the active layer is improved, and the electrical performance of the second thin film transistor is improved. Since the first auxiliary portion and the first connection portion are in the same layer and made of the same material, the connection performance (particularly the electrical contact performance) of the second thin film transistor is improved without adding any film, so that the process is simplified.

It can be understood that in this embodiment, the first connection portion 210 is also directly electrically connected to the second source/drain electrode 420 through a via in the second active layer 121.

Figure 8:
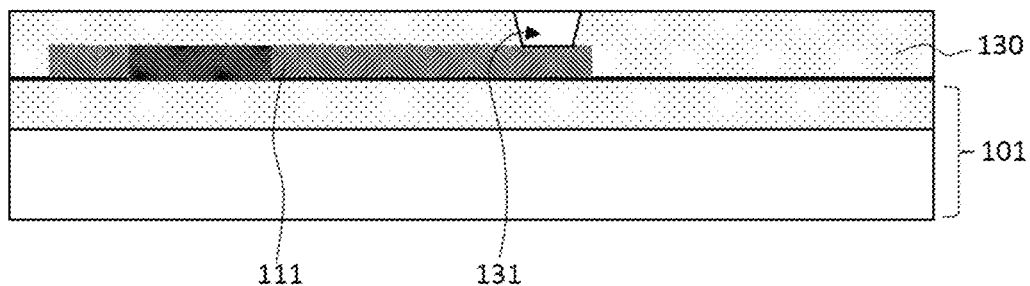
FIG. 8 to FIG. 12 are schematic diagrams illustrating a process for manufacturing an array substrate according to an embodiment of the present disclosure.
Figure 11:
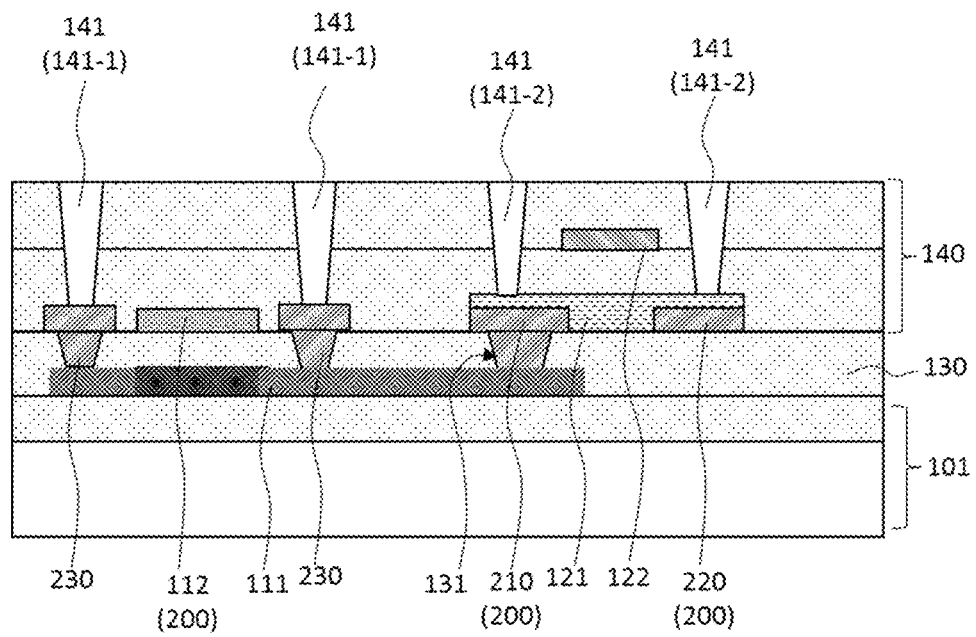
Figure 12:
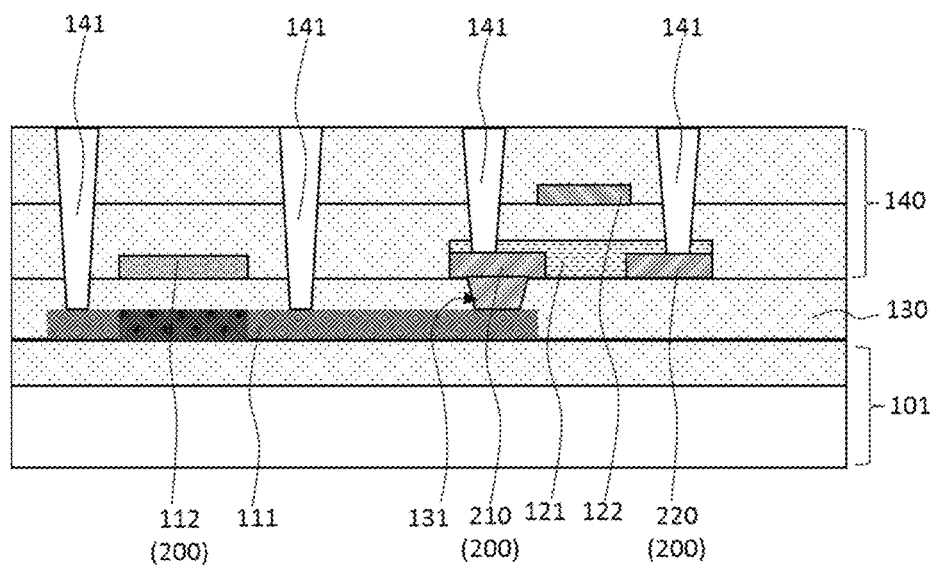

FIG. 8 and FIG. 12 are schematic diagrams illustrating a process for manufacturing an array substrate according to some embodiments of the present disclosure. As shown in FIG. 1, and FIG. 8 to FIG. 12, through the manufacturing process, the array substrate provided in the embodiments of the present disclosure can at least be manufactured. The step and material described above in the present disclosure, or the step same as that in the related art will not be repeated.

The manufacturing process provided in this embodiment includes the steps described below.

First, as shown in FIG. 8, a substrate 101 is provided, and a first active layer 111 of a first thin film transistor is formed on one side of the substrate 101. The first active layer 111 includes a channel region, and a source contact region and a drain contact region positioned on two sides of the channel region. In the figure, the hatch pattern of the channel region is different from the hatch pattern of the source contact region and the drain contact region positioned on the two sides of the channel region.

A first insulating layer 130 is formed on one side, away from the substrate 101, of the first active layer 111. A first via 133 exposing one of the source contact region and the drain contact region of the first active layer 111 is formed in the first insulating layer 130. That is, the first via 133 penetrates through the first insulating layer 130, and exposes one of the source contact region or the drain contact region of the first active layer 111.

Figure 9:
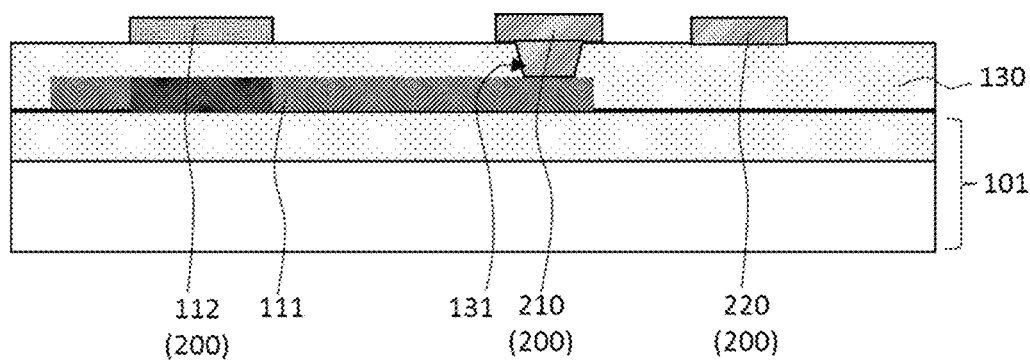

Then, as shown in FIG. 9, a first metal layer 200 is formed on one side, away from the substrate 101, of the first insulating layer 130.

The first metal layer 200 is patterned to at least form a first connection portion 210. The first connection portion 210 overlaps one of the source contact region and the drain contact region of the first active layer 111, and contacts the one of the source contact region and the drain contact region of the first active layer 111 through the first via 133.

In one or more embodiments, the patterned first metal layer 200 further includes a first gate electrode 112 formed simultaneously with the first connection portion 210. The first gate electrode 112 is positioned on the first insulating layer 130, and overlaps the channel region of the first active layer 111. Therefore, the number of the films in the array layer can be reduced, so that the thinning of the array substrate is facilitated.

In one or more embodiments, the material of the first metal layer 20 may be one of Mo, Ti or Al, or a combination of several of Mo, Ti and Al.

Figure 10:
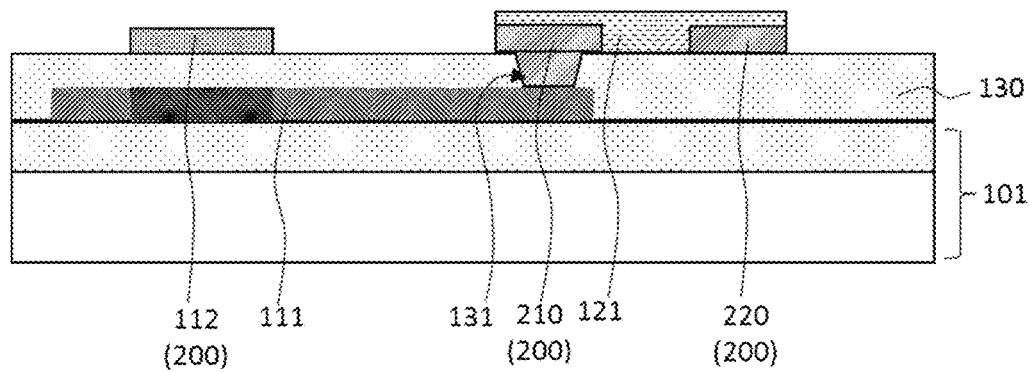

Subsequently, as shown in FIG. 10, a second active layer 121 of a second thin film transistor 120 is formed on one side, away from the substrate, of the first metal layer 200. The second active layer 121 includes a channel region, and a source contact region and a drain contact region positioned on two sides of the channel region. In FIG. 10, the hatch pattern of the channel region is different from the hatch pattern of the source contact region and the drain contact region positioned on the two sides of the channel region.

In one or more embodiments, the first connection portion 210 overlaps and contacts one of the source contact region and the drain contact region of the second active layer 121.

Then, in one embodiment, as show in FIG. 11, a second insulating layer 140 is formed on one side, away from the substrate 101, of the second active layer 121. The second insulating layer 140 is provided with a second via 141-2 exposing one of the source contact region and the drain contact region of the second active layer 121.

In one or more embodiments, the second insulating layer 140 further includes a first sub-layer and a second sub-layer stacked along a direction perpendicular to the plane in which the array substrate is positioned, and a second gate electrode 122 of the second thin film transistor 120, where the second gate electrode 122 is between the first sub-layer and the second sub-layer. In one or more embodiments, the second gate electrode 122 overlaps the channel region of the second active layer 121, and the second gate electrode 122 is made of a metal material, which may be one of Mo, Ti or Al, or a combination of several of Mo, Ti and Al. The same embodiments of the second gate electrode 122 as the first gate electrode 112 will not be repeated.

In one or more embodiments, a via 141 exposing the source contact region, a via 141 exposing the source or drain contact region of the first active layer 121 and a via 141 exposing the other one of the source contact region and the drain contact region of the second active layer 121 may be formed simultaneously with the second via 141-2.

As shown in FIG. 12, in one embodiment, after the second via 141-2 is formed, a fifth via exposing the first connection portion 210 is formed in a region of the second active layer 121 exposed by the second via 141-2 (where the second via 141-2 and the fifth via are communicated along the direction perpendicular to the array substrate).

After being formed, the second source/drain electrode 420 contacts the first connection portion 210 through the second via and the fifth via.

According to the present disclosure, the source and drain electrodes of the two thin film transistors are electrically connected. Meanwhile, since the orthographic projection of one of the source contact region and the drain contact region of the first active layer 111, the orthographic projection of one of the source contact region and the drain contact region of the second active layer 121, and the orthographic projection of the first connection portion 210, onto the plane in which the array substrate 100 is positioned, overlap each other, a conductive connection component (that is, the first connection portion) for connecting the two thin film transistors does not need occupy extra area of the array substrate. Further, the first connection portion is directly covered by the second active layer, and no other film layer needs be added there between, so that the thinning of the array substrate is facilitated, and while the picture quality is ensured, the manufacturing process is simplified, and more circuit space can be saved.

In addition, the conductive treatment of IGZO can be replaced by disposing the fifth via and electrically connecting the second source/drain electrode to the first connection portion through the via in the source or drain contact area of the second active layer, and the contact performance of the source/drain electrode and the active layer is improved and the electrical performance of the second thin film transistor is improved.

Then, as shown in FIG. 1, a second metal layer 400 is formed on one side, away from the substrate 101, of the second insulating layer 140.

The second metal layer 400 is patterned to at least form a second source/drain electrode 420 overlapping at least one of the source contact region or the drain contact region of the second active layer. The second source/drain electrode 420 is electrically connected to the source/drain contact region of the second active layer 112 through the second via 141-2.

In one or more embodiments, the step in which the second metal layer 400 is patterned further includes that a first source/drain electrode 410 overlapping at least one of the source contact region or the drain contact region of the first active layer 111 is formed. The first source/drain electrode 410 is electrically connected to the source/drain contact region of the first active layer 111 through the via 141 in the second insulating layer 140 and the via in the first insulating layer 130. In one embodiment, the second metal layer 400 on the second insulating layer 130 includes the source electrode and the drain electrode of the first thin film transistor 110, which are obtained through patterning and spaced apart from each other.

Figure 13:
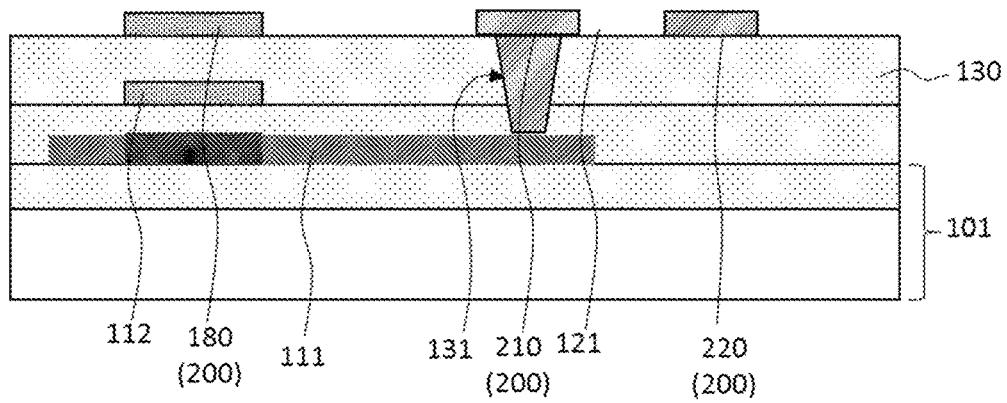
FIG. 13 is a schematic diagram illustrating another process for manufacturing an array substrate according to an embodiment of the present disclosure.

FIG. 13 is a schematic diagram illustrating another procedure for manufacturing an array substrate according to an embodiment of the present disclosure. As shown in FIG. 5 and FIG. 13, in one embodiment, a first active layer 111, a gate insulating layer, a first gate electrode 112, a first insulating layer 130, a first metal layer 200, a second active layer 121, a first sub-layer of a second insulating layer 140, a second gate electrode 122, a second sub-layer of the second insulating layer 140 and a second metal layer 400 are sequentially stacked along a direction away from a substrate 101.

In one or more embodiments, the array substrate 100 further includes a capacitor electrode 180 positioned on the first insulating layer 130. The capacitor electrode 180 and a first connection portion 210 are insulating from each other, but are in the same layer and made of the same material.

The capacitor electrode 180 and a first connection portion 210 are conductive patterns, which are spaced apart or insulated from each other, and are formed in the same patterning process (for example, etching) on the metal material of the first metal layer 200. Therefore, the number of the films in the array layer can be reduced, so that the thinning of the array substrate is facilitated.

FIG. 14 to FIG. 17 are schematic diagrams illustrating another procedure for manufacturing an array substrate according to an embodiment of the present disclosure. The same embodiments of this embodiment as the above-mentioned embodiments will not be repeated.

Figure 14:
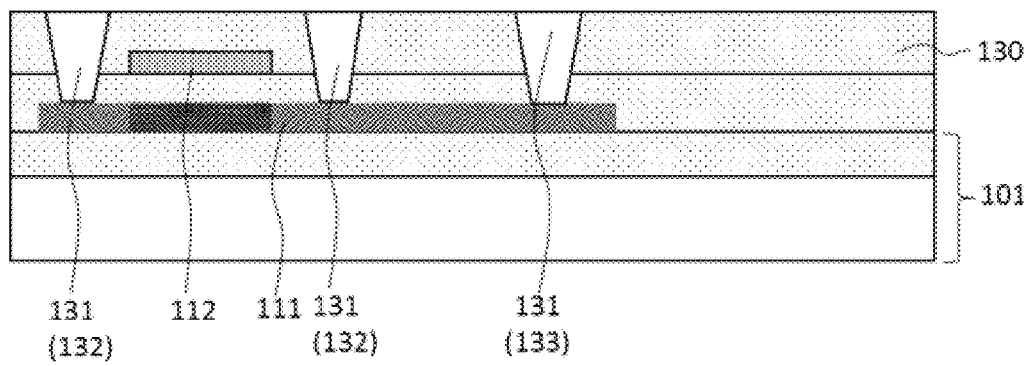
FIG. 14 to FIG. 17 are schematic diagrams illustrating another process for manufacturing an array substrate according to an embodiment of the present disclosure.

Differently, as shown in FIG. 14, after a first insulating layer 130 is formed on one side, away from a substrate 101, of a first active layer 111, a third via 132 exposing one of a source contact region and a drain contact region of a first active layer 111 is formed in the first insulating layer 130.

In one embodiment, the first insulating layer 130 is formed on the side, away from the substrate 101, of the first active layer 111. The first insulating layer 130 is provided with a first via 133 exposing one of the source contact region and the drain contact region of the first active layer 111. Meanwhile, the third via 132 is formed in the process of forming the first via 133.

In one or more embodiments, the first active layer 111 is low temperature poly silicon, and the second active layer 121 is an oxide semiconductor.

Before the first metal layer 200 is formed, the first active layer 111 is processed with hydrofluoric acid.

Figure 15:
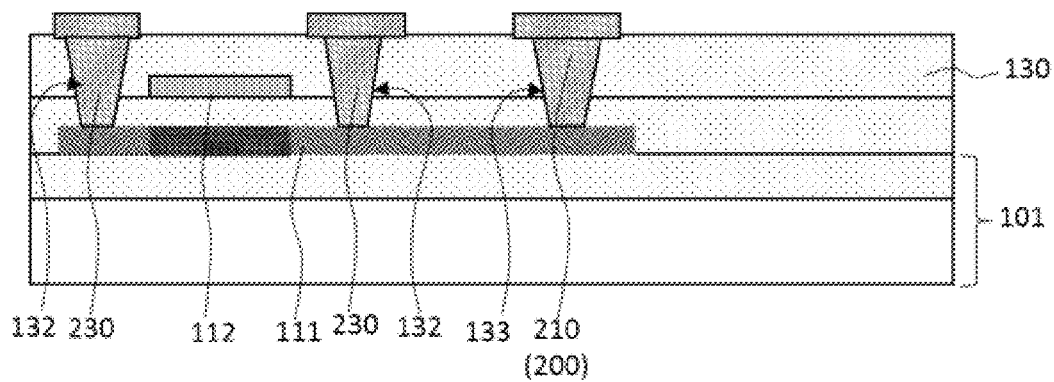

Then, as shown in FIG. 15, a first metal layer 200 is formed on one side, away from the substrate 101, of the first insulating layer 130.

The first metal layer 200 is patterned to at least form a first connection portion 210. The first connection portion 210 overlaps one of the source contact region and the drain contact region of the first active layer 111, and contacts the one of the source contact region and the drain contact region of the first active layer 111 through the first via 133. Meanwhile, patterning the first metal layer 200 further includes forming a second connection portion 230. The second connection portion 230 overlaps at least one of the source contact region or the drain contact region of the first active layer 111, and is electrically connected to one of the source contact region and the drain contact region of the first active layer 111 through the third via 132.

Figure 16:
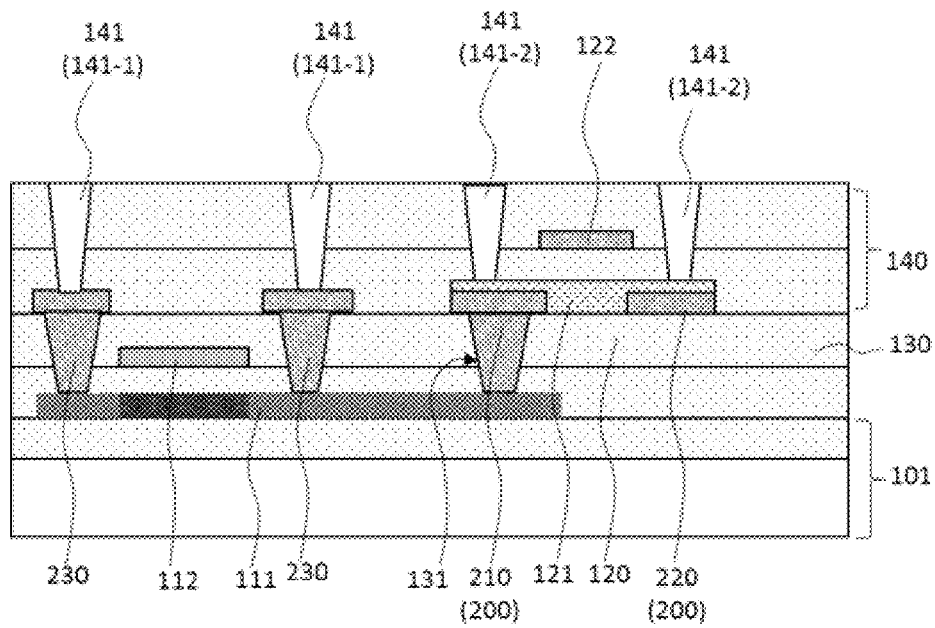

Then, as shown in FIG. 16, in one embodiment, a second active layer 121 and a second insulating layer 140 are formed on the first insulating layer 130 and the first metal layer 200.

A fourth via 141-1 exposing the second connection portion 230 is formed in the second insulating layer 140.

Figure 17:
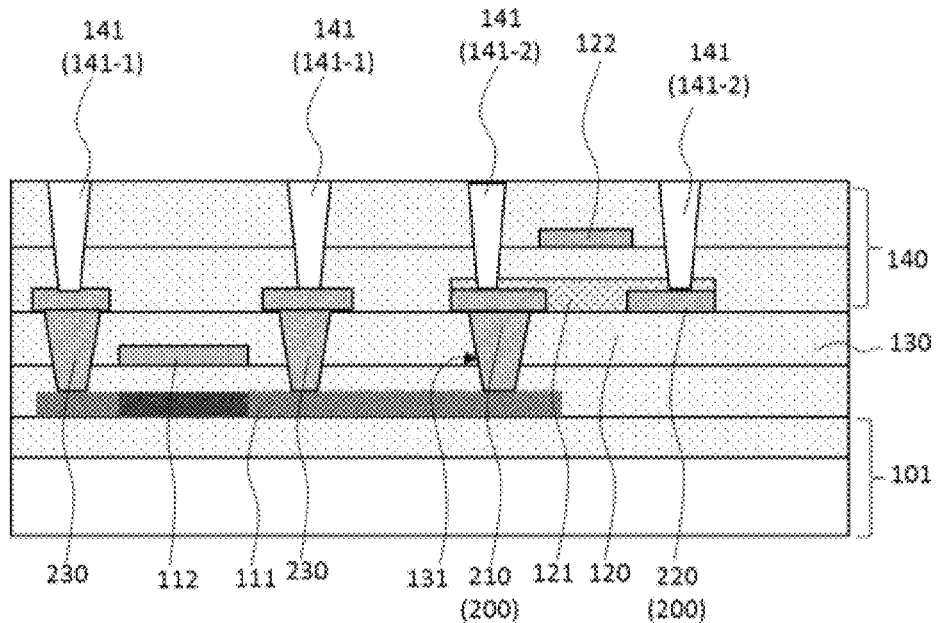
Figure 18:
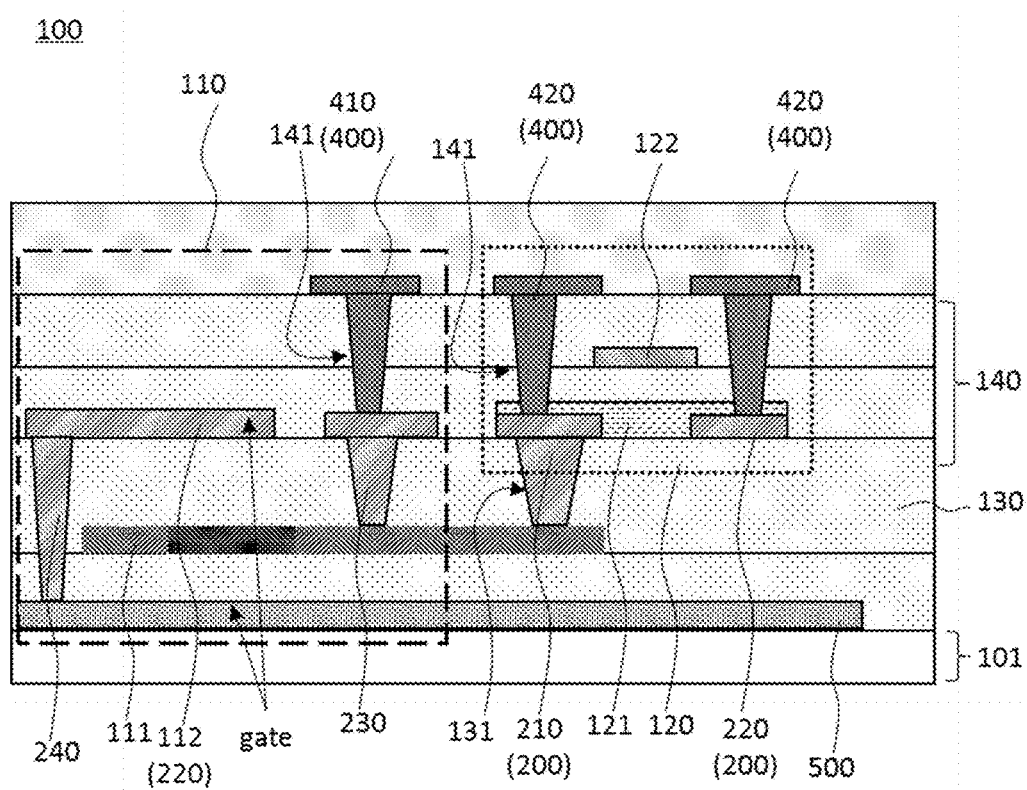
FIG. 18 to FIG. 28 are schematic diagrams of other array substrates according to embodiments of the present disclosure.
Figure 19:
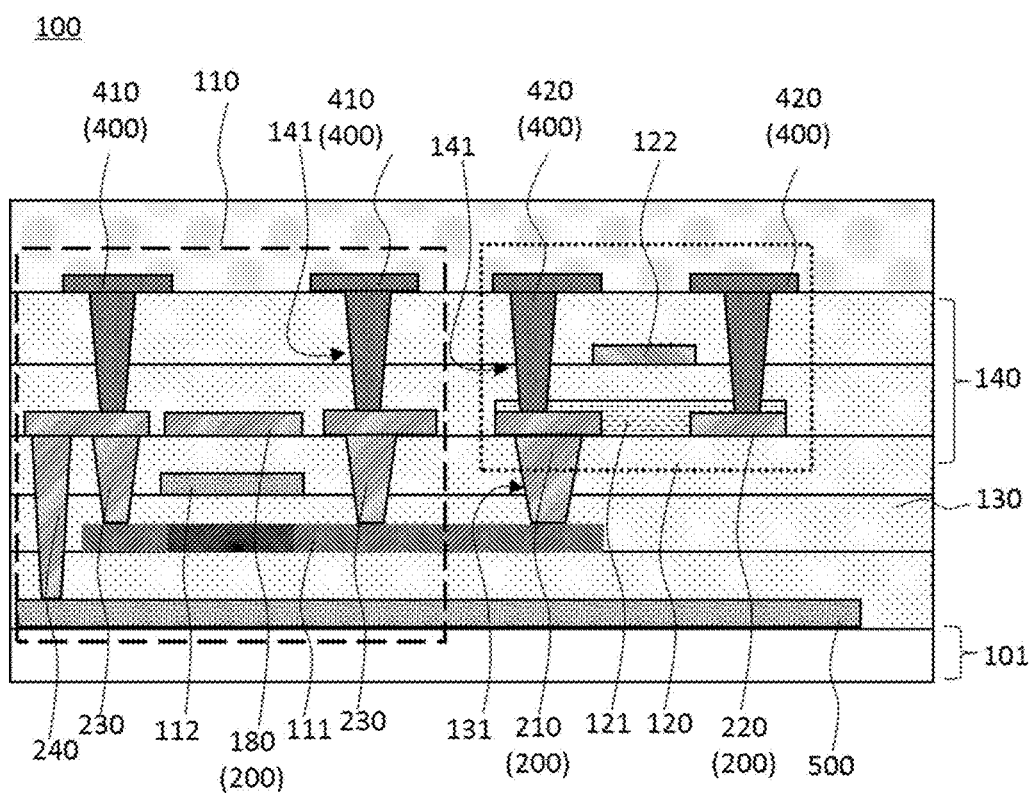

Subsequently, as shown in FIG. 17, a second metal layer 400 is formed on one side, away from the substrate 101, of the second insulating layer 140.

The second metal layer 400 is patterned to at least form a second source/drain electrode 420 overlapping at least one of a source contact region and a drain contact region of the second active layer 121, and meanwhile, a first source/drain electrode 410 overlapping at least one of the source contact region and the drain contact region of the first active layer 111 is formed. The second source/drain 420 is electrically connected to the source/drain contact region of the second active layer 121 through the second via 141-2. The first source/drain electrode 410 is electrically connected to the source/drain contact region of the first active layer 111 through the fourth via 141-1 and the second connection portion 230.

According to the present disclosure, in one embodiment, the source and drain electrodes of the two thin film transistors are electrically connected. Further, since the orthographic projection of one of the source contact region and the drain contact region of the first active layer, the orthographic projection of one of the source contact region and the drain contact region of the second active layer, and the orthographic projection of the first connection portion, onto the plane in which the array substrate is positioned, overlap each other, the conductive connection component (that is, the first connection portion) for connecting the two thin film transistors does not need to occupy extra area of the array substrate. The connection component is directly covered by the second active layer, and no other film layer needs be added there between, so that the thinning of the array substrate is facilitated. In addition, the source/drain electrode of the first thin film transistor is electrically connected to the source/drain electrode of the second thin film transistor, and a space exists between the source/drain electrode of the first thin film transistor and the source/drain electrode of the second thin film transistor. This space can avoid crosstalk caused by too close conductive components on one hand, and can provide space for other traces or designs and reserve space for process deviation on the other hand. Therefore, while the picture quality is ensured, the manufacturing process is simplified, and more circuit space can be saved.

In another embodiment, since the first active layer is low temperature poly silicon, it needs to process the source contact region and the drain contact region of the first active layer with HF. In one embodiment, first a via exposing the source contact region and a via exposing the drain contact region of the first active layer (for simplifying the process, the vias are used for connecting the source and drain electrodes to the source and drain contact regions in this embodiment) are formed, and then the source and drain contact regions exposed by the via are processed with HF acid. The inventor finds that if the first connection portion is formed later than the second active layer, then the vias exposing the source contact region and the drain contact region are formed by etching after the second active layer is formed. Since HF acid process is performed before the first connection portion is formed, the second active layer is etched, and a circuit problem is caused.

According to this embodiment, the second connection portion is formed before the second active layer is formed, and the source contact region and the drain contact region of the first active layer are connected to the source electrode and the drain electrode through second connection portions respectively, and the second active layer will not be affected by the process of another film. Further, since the second connection portion and the first connection portion are in the same layer and made of the same material, the connection performance (particularly the electrical contact performance) of the first thin film transistor is improved without adding any film, so that the process is simplified. According to this embodiment, instead of penetrating through the second active layer through second source or drain electrode, the first connection portion is used for connection, and the first connection portion is on the side, facing the first active layer, of the second active layer, that is, the first connection portion is formed before the second active layer, so that both the problem of over-etching and the above-mentioned problem of circuit connection can be avoided. In addition, the conductive treatment of IGZO can be replaced by the first auxiliary portion that is connected to the second source or drain electrode through the via in the source or drain contact region of the second active layer, and the contact performance of the source and drain electrodes and the active layer is improved, and the electrical performance of the second thin film transistor is improved. Since the first auxiliary portion and the first connection portion are in the same layer and made of the same material, the connection performance (particularly the electrical contact performance) of the second thin film transistor is improved without adding any film, so that the process is simplified.

Referring to FIGS. 18 to 28, FIGS. 18 to 28 are respectively schematic diagrams of other array substrates according to embodiments of the present disclosure. The same embodiments of the array substrates in these embodiments as those in the above-mentioned embodiments will not be repeated.

In one or more embodiments, the array substrate 100 further includes an auxiliary conductive layer 500 below the first active layer 111 and an auxiliary connection portion 240 electrically connected to auxiliary conductive layer 500, where the auxiliary connection portion 240 and the first connection portion 210 are arranged in the same layer and made of the same material. In these embodiments, the manufacturing of the required connection structure (i.e., the auxiliary connection portion) of the auxiliary conductive layer may be completed together with the manufacturing process for the first connection portion, and the connection via for the auxiliary connection portion may be prepared together with the step of preparing the connection via for the first connection portion connected to the first active layer. That is, the via (i.e., the via for the auxiliary connection portion 240) penetrating through the insulating layer between the first connection portion and the auxiliary conductive layer to expose the auxiliary conductive layer and the via (i.e., the via 131 for the first connection portion 210) penetrating through the insulating layer 130 between the first connection portion and the first active layer to expose one of the source contact region or the drain contact region of the first active layer are prepared in the same step, so that the problem of over-etching can be avoided. In addition, such two vias may have the same starting position (etchings for both vias are started from the first insulating layer below the first connection portion) with an approximate depth, and thus, the degree of via etching is easy to control, to avoid the problem of size unevenness of the vias.

In an embodiment, the auxiliary conductive layer 500 is located between the first active layer 111 and the substrate 101. Of course, in other example embodiments of the present disclosure, the auxiliary conductive layer may be located between a barrier layer (also called a buffer layer) and the substrate, or between the first active layer and a barrier layer.

In one or more embodiments, the auxiliary conductive layer 500 is made of a light-shielding material. In one or more embodiments, the auxiliary conductive layer 500 is made of a metal material.

In an embodiment, the area of the auxiliary conductive layer 500 is larger than the area of the first active layer 111, so that the first active layer 111 can be completely covered, that is, the orthographic projection of the first active layer 111 on the substrate 101 falls into the orthographic projection of the auxiliary conductive layer 500 on the substrate 101.

In one or more embodiments, the orthographic projection of the first thin film transistor 110 on the substrate 101 falls within the orthographic projection of the auxiliary conductive layer 500 on the substrate 101.

In this way, the auxiliary conductive layer 500 can be used to shield light, so that for example, when the substrate is irradiated with a laser and then removed from a carrier substrate that carries the substrate, the devices in the array substrate can be prevented from being affected. The auxiliary conductive layer 500 can also prevent the first active layer 111 from being affected by light, to improve the stability of the first thin film transistor 110; especially when the first thin film transistor 110 is used as a driving transistor in a pixel driving circuit, the auxiliary conductive layer 500 can prevent the first active layer 111 from being affected by light, to ensure the stability of the threshold voltage of the first thin film transistor 110.

In one or more embodiments, the auxiliary conductive layer 500 overlaps the first active layer 111 and is multiplexed as the gate electrode of the first thin film transistor 110. In one embodiment, the orthographic projection of at least part of the auxiliary conductive layer 500 on the substrate 101 overlaps the orthographic projection of the channel region of the first active layer 111 on the substrate 101. The at least part of the auxiliary conductive layer 500 may form the bottom gate electrode of the first thin film transistor 110.

In one or more embodiments, the first thin film transistor 110 further includes a first gate electrode 112 located above the first active layer 111 and an auxiliary gate electrode located bellow the first active layer 111. In other words, the first thin film transistor 110 is a double-gate transistor. In this way, especially when the first thin film transistor 110 is used as a driving transistor, the electrical performance of the pixel driving circuit can be improved.

In one or more embodiments, the first gate electrode 112 and the first connection portion 210 are insulated from each other, but are in the same layer and made of the same material; the auxiliary connection portion 240 is at least partially multiplexed as the first gate electrode 112; and the at least part of the auxiliary conductive layer 500 is multiplexed as the auxiliary gate electrode. In an embodiment illustrated in any one of FIG. 18, FIG. 21 and FIG. 28, the auxiliary connection portion 240 is multiplexed as the first gate electrode 112, that is, the auxiliary connection portion 240 and the first gate electrode 112 are not only arranged in the same layer and made of the same material, but also are integrally formed.

In other words, the electrical connection between the double gate electrodes and the fabrication of part of the double gate electrodes can be implemented by the auxiliary connection portion and the corresponding via manufactured in the same process as the first connection portion and the via corresponding to the first connection portion. Therefore, through this embodiment, the connection between the internal sub-component structures of the double-gate first thin film transistor can be formed together with the manufacture of the first connection portion.

Figure 28:
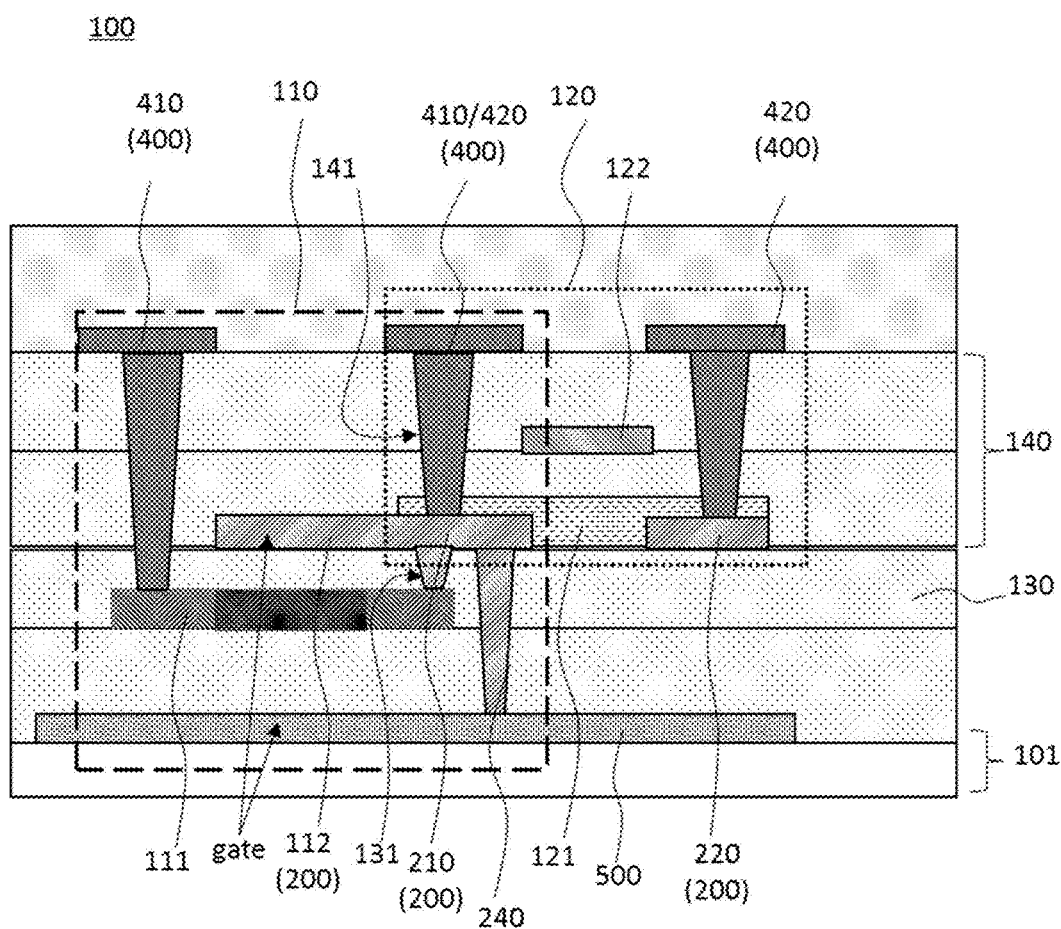

In one or more embodiments, as shown in FIG. 28, the auxiliary connection portion 240, the first gate electrode 112 and the first connection portion 210 are all arranged in the same layer and made of the same material and are also integrally formed, that is, the three are manufactured in the same manufacturing process. In this way, the manufacturing process can be simplified and the space occupied by the circuit connection structure can be reduced while meeting the circuit connection requirements and taking into account the effects of the foregoing embodiments.

As shown in FIGS. 19 to 25, in one or more embodiments, the gate and drain electrodes of the first thin film transistor 110 are electrically connected through the auxiliary connection portion 240; or the gate and source electrodes of the first thin film transistor 110 are electrically connected through the auxiliary connection portion 240. Through these embodiments, the specific circuit connection requirements are met without introducing the additional manufacturing process and increasing the occupied space. Especially when the first thin film transistor 110 is used as a driving transistor in a pixel driving circuit, the first thin film transistor 110 can be applied to some specific driving methods or signal supplement methods.

In some embodiments of the present disclosure, the auxiliary connection portion may be multiplexed as the first connection portion or the second connection portion. The second connection portion is located on the first metal layer, overlaps at least one of the source contact region or the drain contact region of the first active layer, and is electrically connected to the at least one of the source contact region or the drain contact region of the first active layer through the via in the first insulating layer.

Figure 20:
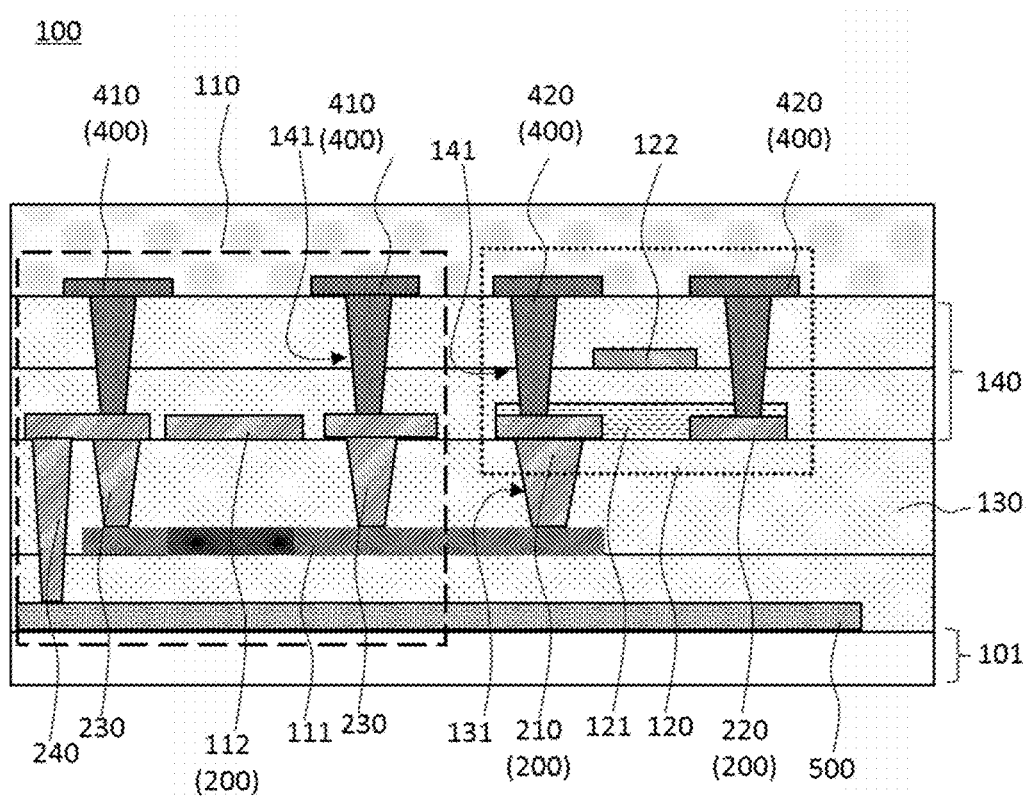
Figure 21:
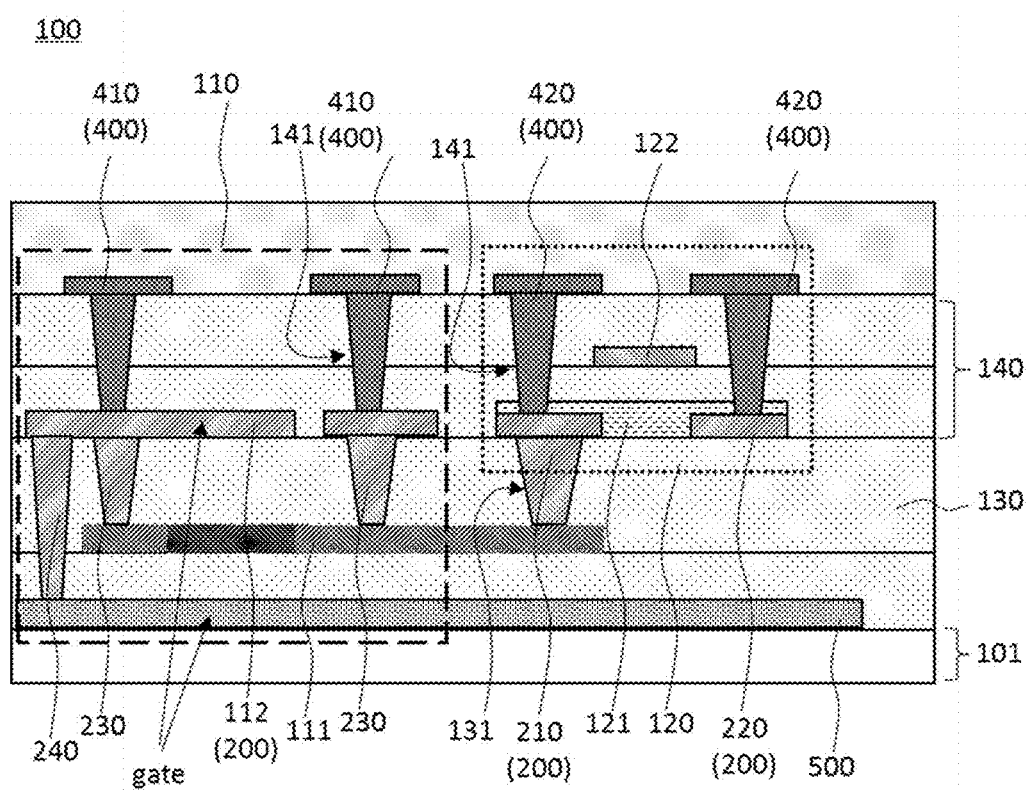
Figure 22:
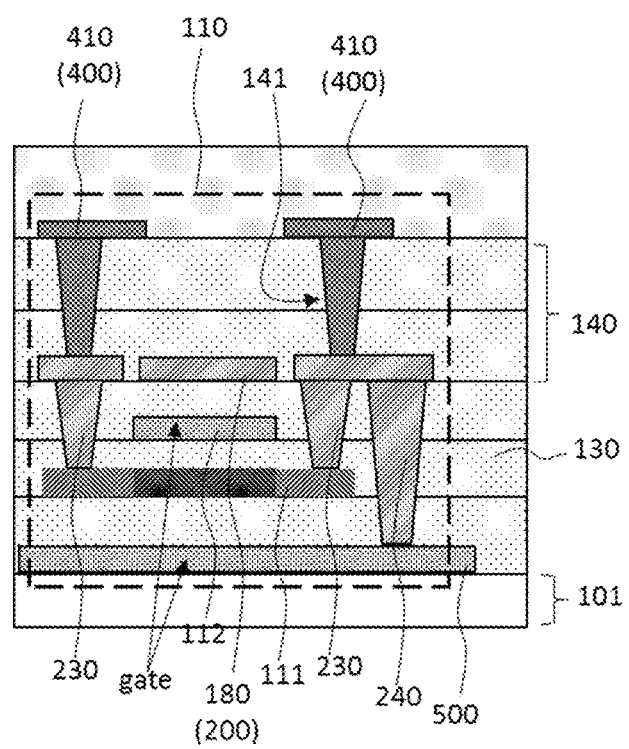
Figure 23:
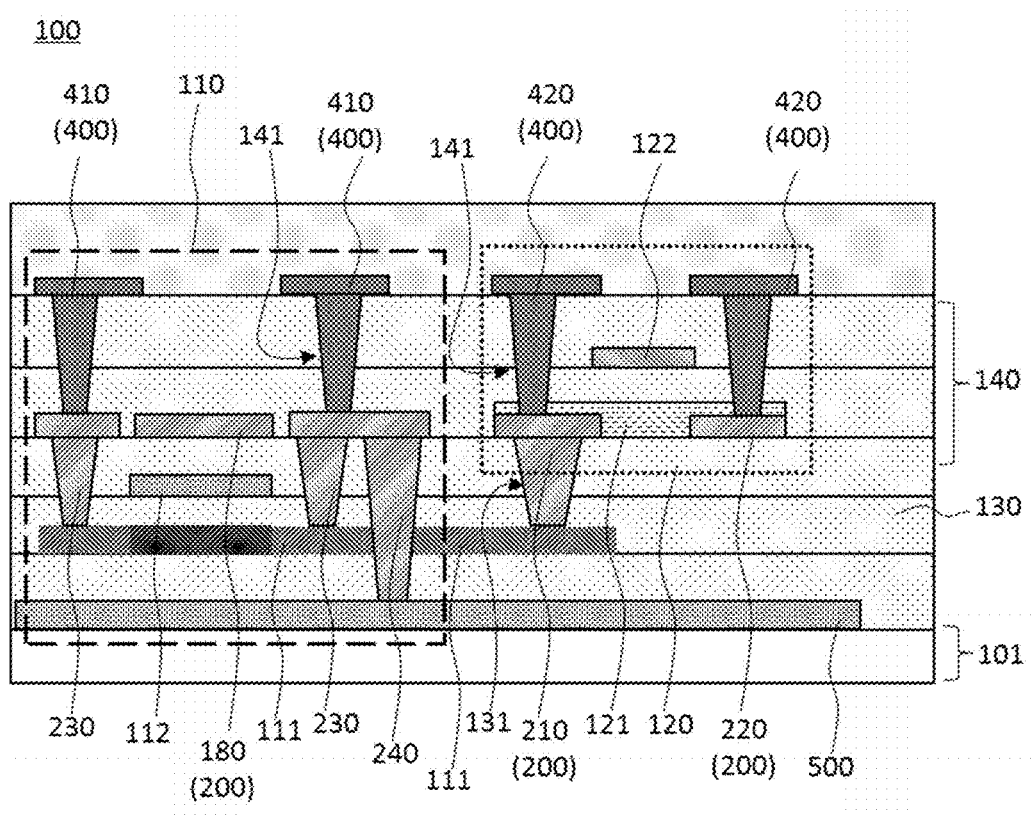
Figure 24:
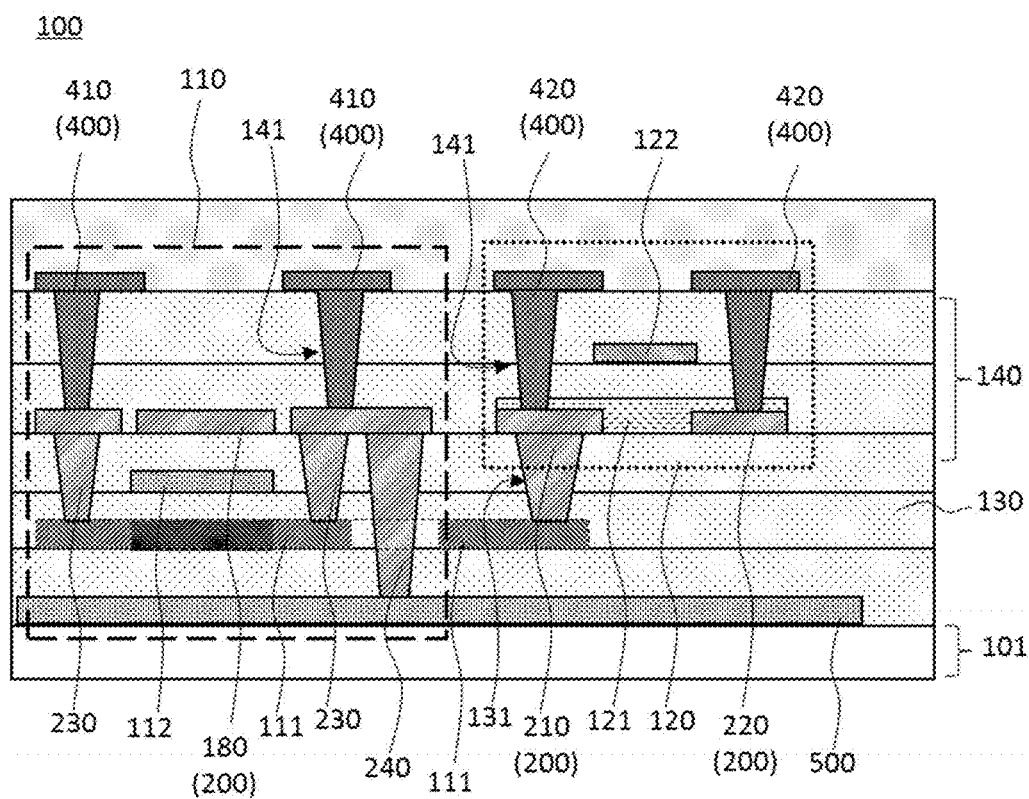
Figure 25:
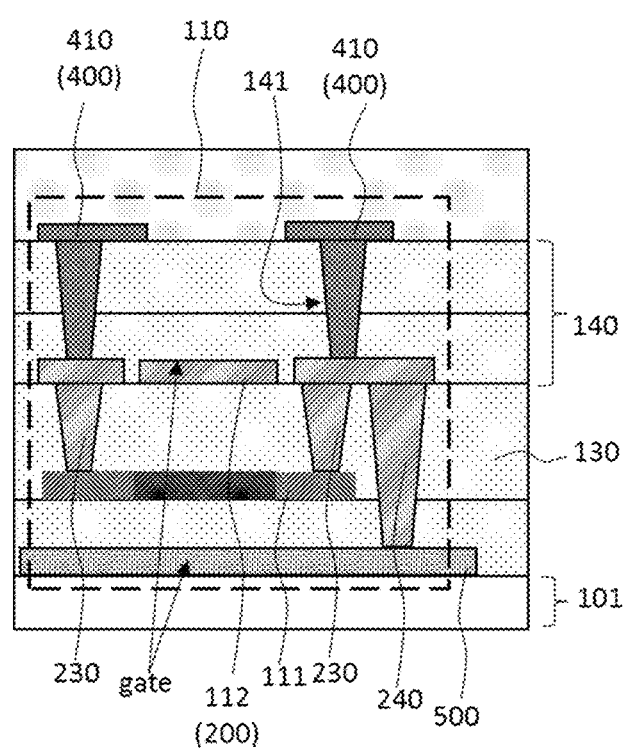

For example, as shown in FIGS. 19 to 25, the auxiliary connection portion 240 is multiplexed as the second connection portion 230. That is to say, the auxiliary connection portion 240 and the second connection portion 230 are integrally formed, and the auxiliary connection portion 240 is multiplexed with the manufacturing process and materials of the second connection portion 230; or to say the second connection portion 230 achieves the connection between the source/drain electrode of the first thin film transistor 110 and the gate electrode of the first thin film transistor 110. In one or more embodiments, in a case where the auxiliary conductive layer 500 is the gate electrode of the first thin film transistor 110, the second connection portion 230 actually achieves the connection between the source/drain electrode of the first thin film transistor 110 and the gate electrode of the first thin film transistor 110, so that the specific circuit connection requirements are met without introducing the additional manufacturing process and increasing the occupied space. As shown in FIGS. 19 and 22 to 24, the auxiliary connection portion 240 (i.e., the second connection portion 230) and the capacitor electrode 180 are arranged in the same layer and made of the same material. As shown in FIGS. 20 to 21 and 25, the auxiliary connection portion 240 (i.e., the second connection portion 230) and the first gate electrode 112 are arranged in the same layer and made of the same material. As shown in FIG. 21, the auxiliary connection portion 240, the second connection portion 230 and the first gate electrode 112 are all arranged in the same layer and made of the same material and are also integrally formed, that is, the three are manufactured in the same manufacturing process. In this way, the manufacturing process can be simplified and the space occupied by the circuit connection structure can be reduced while meeting the circuit connection requirements and taking into account the effects of the foregoing embodiments.

Of course, in other example embodiments of the present disclosure, the second connection portion 230 and the first gate electrode 112 may be integrally connected on the basis of the embodiment shown in FIG. 25, so that the double-gate structure of the first thin film transistor 110 can be achieved.

It should be noted that other features of the second connection portion can be combined with any of the foregoing embodiments if not in collision, and will not be repeated here.

It should be noted that, the case illustrated in FIG. 23 can be understood as the case where the auxiliary connection portion 240 penetrates through the first active layer 111 but is in contact with the first active layer 111. In one or more embodiments, only one auxiliary connection portion 240 may be provided to achieve both the connection between the source/drain electrode and the first active layer and the connection between the source/drain electrode and the auxiliary conductive layer 500, to omit the via only penetrating through the insulating layer between the first metal layer and the first active layer.

As shown in FIG. 24, it should be understood that the first active layer 111 may avoid the auxiliary connection portion 240. In this case, the first active layer 111 does not directly contact the auxiliary connection portion 240. The dashed box corresponding to the first active layer in FIG. 24 indicates that the first active layer 111 of this level is continuous in the interface out of the shown sectional view.

Figure 26:
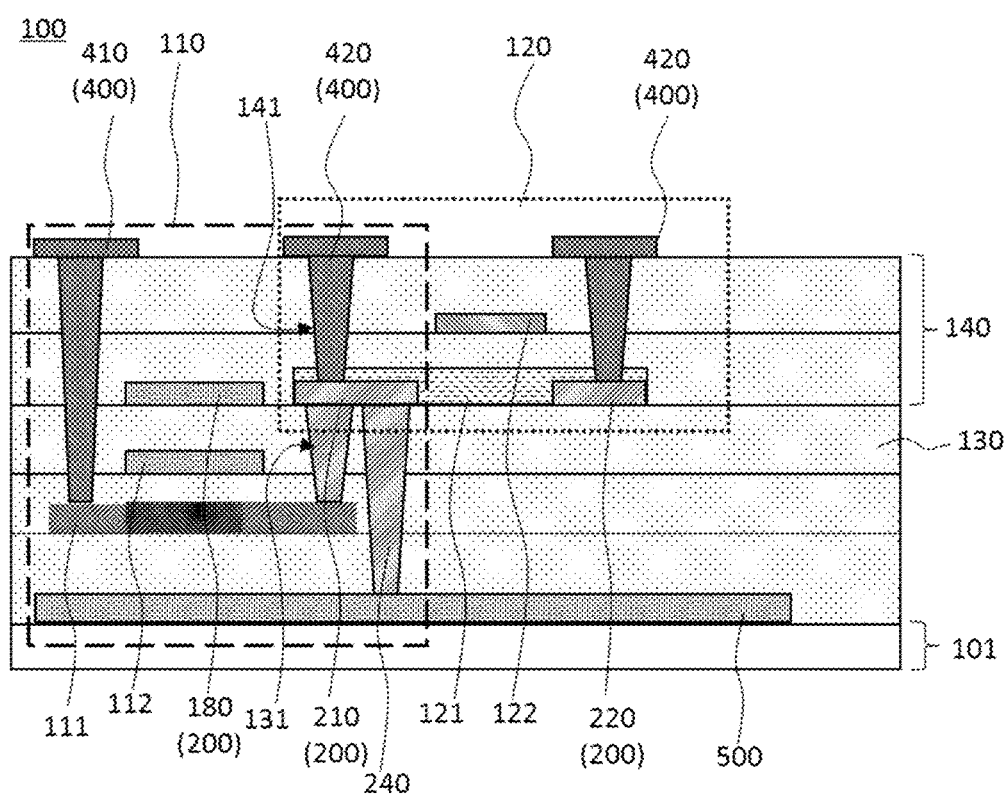
Figure 27:
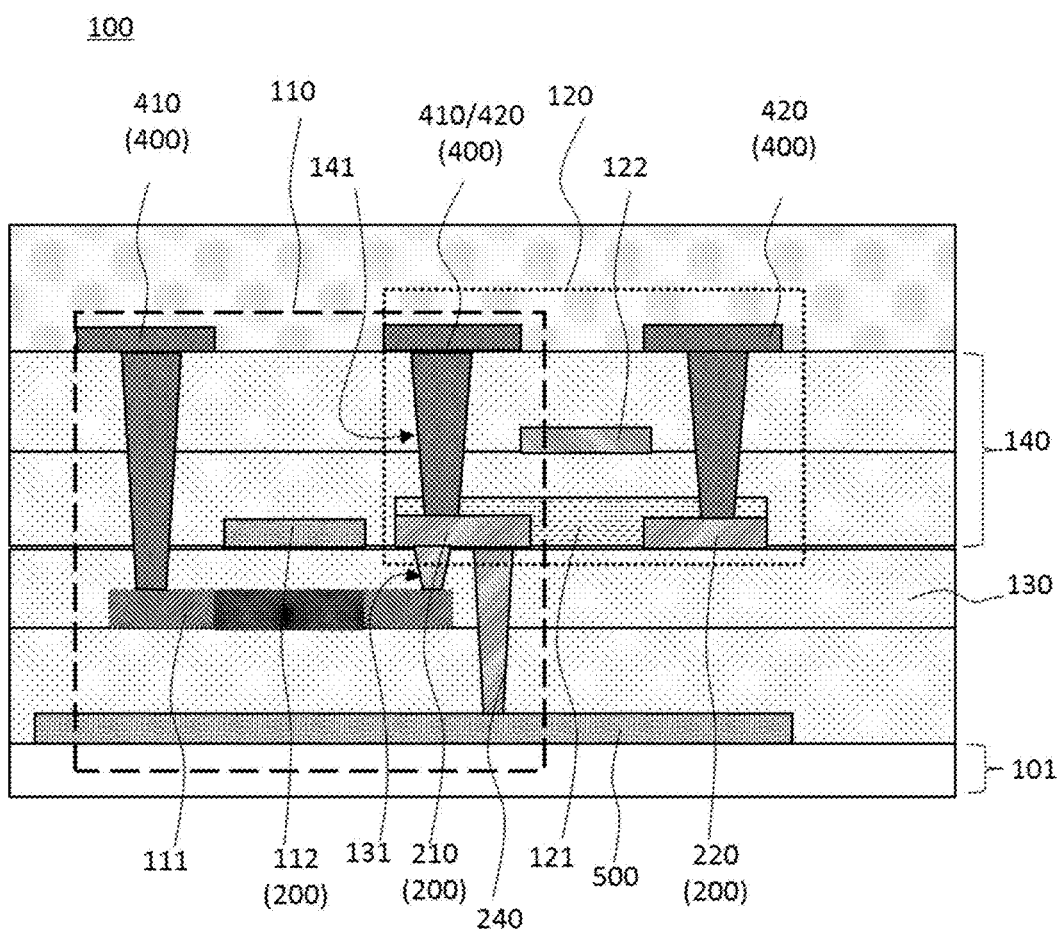

In one or more embodiments, as shown in FIGS. 26 to 28, the auxiliary connection portion 240 is multiplexed as the first connection portion 210. In other words, the auxiliary connection portion 240 is integrally formed with the first connection portion 210, or the first connection portion 210 satisfies the aforementioned various requirements for the auxiliary connection portion 240, and thus the first connection portion 210 can replace the auxiliary connection portion.

In one or more embodiments, the first source/drain electrode 410 is multiplexed as the second source/drain 420, and reference may be made to the above-mentioned embodiments for details, which will not be repeated here.

In one or more embodiments, as shown in FIG. 26, the auxiliary connection portion 240 (i.e., the first connection portion 210) and the capacitor electrode 180 are arranged in the same layer and made of the same material. As shown in FIGS. 27 to 28, the auxiliary connection portion 240 (i.e., the first connection portion 210) and the first gate electrode 112 are arranged in the same layer and made of the same material. As shown in FIG. 28, the auxiliary connection portion 240, the first connection portion 210 and the first gate electrode 112 are all arranged in the same layer and made of the same material and are also integrally formed, that is, the three are manufactured in the same manufacturing process. In this way, the manufacturing process can be simplified and the space occupied by the circuit connection structure can be reduced while meeting the circuit connection requirements and taking into account the effects of the foregoing embodiments.

What is claimed is:

1. An array substrate, comprising:
    a substrate;
    a first active layer of a first thin film transistor, wherein the first active layer comprises a channel region, a source contact region and a drain contact region, wherein the source contact region and the drain contact region are positioned on two sides of the channel region;
    a first insulating layer on the first active layer;
    a first metal layer on the first insulating layer, wherein the first metal layer comprises a first connection portion, and the first connection portion overlaps one of the source contact region or the drain contact region of the first active layer;
    an auxiliary conductive layer located below the first active layer, and an auxiliary connection portion electrically connected to the auxiliary conductive layer, wherein the auxiliary connection portion and the first connection portion are arranged in a same layer and made of a same material; and
    a second active layer of a second thin film transistor, wherein the second active layer is on the first insulating layer and the first connection portion, and comprises a channel region, a source contact region and a drain contact region, wherein the source contact region and the drain contact region are positioned on two sides of the channel region, and the first connection portion overlaps one of the source contact region or the drain contact region of the second active layer,
    wherein the one of the source contact region or the drain contact region of the first active layer and the one of the source contact region or the drain contact region of the second active layer overlap, and are electrically connected to each other through the first connection portion and a via in the first insulating layer.

2. The array substrate of claim 1, wherein the first active layer is a low temperature poly silicon, and the second active layer is an oxide semiconductor.

3. The array substrate of claim 1, wherein the first thin film transistor further comprises a first gate electrode overlapping the channel region of the first active layer, wherein the first gate electrode and the first connection portion are insulated from each other, arranged in a same layer and made of a same material.

4. The array substrate of claim 1, further comprising: a capacitor electrode located on the first insulating layer, wherein the capacitor electrode and the first connection portion are insulated from each other, arranged in a same layer and made of a same material.

5. The array substrate of claim 1, wherein the first metal layer further comprises a second connection portion, and the second connection portion overlaps at least one of the source contact region or the drain contact region of the first active layer, and is electrically connected to the one of the source contact region or the drain contact region of the first active layer through a via in the first insulating layer,
wherein a first one of the first connection portion and the second connection portion is connected to the drain contact region of the first active layer, and a second one of the first connection portion and the second connection portion is connected to the source contact region of the first active layer.

6. The array substrate of claim 1, wherein the auxiliary conductive layer overlaps the first active layer and is multiplexed as a gate electrode of the first thin film transistor.

7. The array substrate of claim 1, wherein the first thin film transistor further comprises a first gate electrode located above the first active layer and an auxiliary gate electrode located bellow the first active layer,
wherein the first gate electrode and the first connection portion are insulated from each other, but are arranged in a same layer and made of a same material; the auxiliary connection portion is at least partially multiplexed as the first gate electrode; and at least part of the auxiliary conductive layer is multiplexed as the auxiliary gate electrode.

8. The array substrate of claim 1, wherein the auxiliary connection portion is multiplexed as the first connection portion.

9. The array substrate of claim 1, wherein the auxiliary conductive layer is made of a light-shielding material.

10. The array substrate of claim 1, wherein gate and drain electrodes of the first thin film transistor are electrically connected through the auxiliary connection portion; or gate and source electrodes of the first thin film transistor are electrically connected through the auxiliary connection portion.

11. The array substrate of claim 1, further comprising:
a second insulating layer, located on the second active layer; and
a second metal layer, located on the second insulating layer,
wherein the second metal layer comprises a second source electrode and a second drain electrode overlapping at least one of the source contact region or the drain contact region of the second active layer, and wherein the second source electrode is electrically connected the source contact region of the second active layer through a via in the second insulating layer and the second drain electrode is electrically connected the drain contact region of the second active layer through another via in the second insulating layer,
wherein one of the second source electrode and the second drain electrode overlaps the first connection portion, and is electrically connected to the first connection portion through a via in the one of the source contact region or the drain contact region.

12. The array substrate of claim 11, wherein
the second metal layer further comprises a first source electrode and a first drain electrode overlapping at least one of the source contact region or the drain contact region of the first active layer, and wherein the first source electrode is electrically connected to the source contact region of the first active layer through a via in the second insulating layer, and the first drain electrode is electrically connected to the drain contact region of the first active layer through another via in the second insulating layer.

13. A display panel, comprising: an array substrate, wherein the array substrate comprises:
a substrate;
a first active layer a first thin film transistor, wherein the first active layer is on the substrate, and comprises a channel region, a source contact region and a drain contact region, wherein the source contact region and the drain contact region are positioned on two sides of the channel region;
a first insulating layer on the first active layer;
a first metal layer on the first insulating layer, wherein the first metal layer comprises a first connection portion, and the first connection portion overlaps one of the source contact region or the drain contact region of the first active layer;
an auxiliary conductive layer located below the first active layer, and an auxiliary connection portion electrically connected to the auxiliary conductive layer, wherein the auxiliary connection portion and the first connection portion are arranged in a same layer and made of a same material; and
a second active layer a second thin film transistor, wherein the second active layer is on the first insulating layer and the first connection portion, and comprises a channel region, a source contact region and a drain contact region, wherein the source contact region and the drain contact region are positioned on two sides of the channel region, and the first connection portion overlaps one of the source contact region or the drain contact region of the second active layer,
wherein the one of the source contact region or the drain contact region of the first active layer and the one of the source contact region or the drain contact region of the second active layer overlap, and are electrically connected to each other through the first connection portion and a via in the first insulating layer.

14. A manufacturing method of an array substrate, comprising:
providing a substrate;
forming a first active layer of a first thin film transistor on one side of the substrate, wherein the first active layer comprises a channel region, and a source contact region and a drain contact region located on two sides of the channel region;
forming a first insulating layer on one side, facing away from the substrate, of the first active layer, and forming a first via in the first insulating layer, wherein one of the source contact region or the drain contact region of the first active layer is exposed by the first via;
forming a first metal layer on one side, facing away from the substrate, of the first insulating layer;
patterning the first metal layer to at least form a first connection portion and an auxiliary conductive layer, wherein the first connection portion overlaps one of the source contact region or the drain contact region of the first active layer, and contacts the one of the source contact region or the drain contact region of the first active layer through the first via; and wherein the auxiliary conductive layer is located below the first active layer, an auxiliary connection portion electrically is connected to the auxiliary conductive layer, and the auxiliary connection portion and the first connection portion are arranged in a same layer and made of a same material; and forming, on one side of the first metal layer facing away from the substrate, a second active layer of a second thin film transistor, wherein the second active layer comprises a channel region, and a source contact region and a drain contact region located on two sides of the channel region, and the first connection portion overlaps one of the source contact region or the drain contact region of the second active layer.

15. The manufacturing method of claim 14, wherein patterning the first metal layer further comprises one or more of: forming a gate electrode of the first thin film transistor and forming a capacitor electrode.

16. The manufacturing method of claim 14, further comprising:
forming a second insulating layer on one side, facing away from the substrate, of the second active layer, and forming, in the second insulating layer, a second via exposing one of the source contact region or the drain contact region of the second active layer;
forming a second metal layer on one side, facing away from the substrate, of the second insulating layer; and
patterning the second metal layer to at least form a second source electrode and a second drain electrode overlapping at least one of the source contact region or the drain contact region of the second active layer, wherein one of the second source electrode and the second drain electrode is electrically connected to the one of the source contact region or the drain contact region of the second active layer through the second via.

17. The manufacturing method of claim 16, wherein after forming the second via, the method further comprises forming, in the second active layer which is exposed through the second via, a fifth via exposing the first connection portion; and
after forming the second source electrode and the second drain electrode, one of the second source electrode and the second drain electrode contacts and is connected to the first connection portion through the second via and the fifth via.

18. The manufacturing method of claim 14, wherein after forming the first insulating layer on the one side, facing away from the substrate, of the first active layer, the method comprises forming, in the first insulating layer, a third via exposing the one of the source contact region or the drain contact region of the first active layer; and
wherein patterning the first metal layer further comprises forming a second connection portion, wherein the second connection portion overlaps at least one of the source contact region or the drain contact region of the first active layer, and is electrically connected to the one of the source contact region or the drain contact region of the first active layer through the third via.

19. The manufacturing method of claim 18, wherein the first active layer is a low temperature poly silicon, and the second active layer is an oxide semiconductor; and
before forming the first metal layer, the method comprises processing the first active layer with hydrofluoric acid.

* * * * *